(12) United States Patent
Aoki

(10) Patent No.: US 9,503,024 B2
(45) Date of Patent: Nov. 22, 2016

(54) AMPLIFYING DEVICE

(71) Applicant: FUJITSU LIMITED, Kawasaki-shi, Kanagawa (JP)

(72) Inventor: Nobuhisa Aoki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/939,387

(22) Filed: Nov. 12, 2015

(65) Prior Publication Data

US 2016/0181985 A1    Jun. 23, 2016

(30) Foreign Application Priority Data

Dec. 22, 2014   (JP) ................... 2014-259071

(51) Int. Cl.
*H03F 3/68* (2006.01)
*H03F 1/02* (2006.01)
*H03F 3/19* (2006.01)

(52) U.S. Cl.
CPC .............. *H03F 1/0205* (2013.01); *H03F 3/19* (2013.01); *H03F 2200/231* (2013.01); *H03F 2200/451* (2013.01)

(58) Field of Classification Search
CPC ........................................................ H03F 3/68
USPC ..................... 330/124 R, 295, 107
See application file for complete search history.

(56) References Cited

U.S. PATENT DOCUMENTS

| | | | | |
|---|---|---|---|---|
| 5,146,190 A | * | 9/1992 | Firmain | H03F 3/602 333/101 |
| 5,334,946 A | * | 8/1994 | Kenington | H03F 1/3229 330/144 |
| 5,561,395 A | * | 10/1996 | Melton | H03G 3/3042 330/124 R |
| 6,201,452 B1 | | 3/2001 | Dent et al. | |
| 6,907,202 B1 | * | 6/2005 | Ide | H03G 3/3084 398/208 |
| 2002/0041208 A1 | * | 4/2002 | Hamada | H03F 1/3247 330/149 |
| 2005/0270095 A1 | * | 12/2005 | Burke | H03F 1/02 330/124 R |
| 2007/0076814 A1 | | 4/2007 | Ikeda et al. | |
| 2013/0229227 A1 | | 9/2013 | Maniwa | |
| 2014/0191789 A1 | * | 7/2014 | Saunders | H03H 11/20 327/233 |

FOREIGN PATENT DOCUMENTS

| | | |
|---|---|---|
| JP | 2002-532965 A | 10/2002 |
| JP | 2005-101940 A | 4/2005 |
| JP | 2013-183390 A | 9/2013 |
| JP | 2013-225827 A | 10/2013 |

* cited by examiner

*Primary Examiner* — Patricia T Nguyen
(74) *Attorney, Agent, or Firm* — Arent Fox LLP

(57) ABSTRACT

An amplifying device includes: a signal splitter configured to split an input signal to a plurality of signals having a phase difference between the plurality of signals fluctuating in accordance with an absolute value of an amplitude of the input signal; a plurality of amplifiers configured to amplify the plurality of signals respectively; a combiner configured to combine the amplified plurality of signals to generate an output signal; a selector configured to select one of output signals whose phase is inverted or non-inverted; and a switch controller configured to control the signal splitter so that phases of the plurality of signals are non-inverted, and to control the selector so that the selector selects one of the output signals, in accordance with a first point of time when the absolute value becomes a minimum or a second point of time deviated from the first point by a predetermined time period.

5 Claims, 26 Drawing Sheets

AMPLIFYING DEVICE

CROSS-REFERENCE TO RELATED APPLICATION

This application is based upon and claims the benefit of priority of the prior Japanese Patent Application No. 2014-259071, filed on Dec. 22, 2014, the entire contents of which are incorporated herein by reference.

FIELD

The embodiments discussed herein are related to an amplifying device.

BACKGROUND

In the past, as an amplifying device in which an amplifier is operated in a saturated state, there has been an amplifying device based on an outphasing method (hereinafter, called an "outphasing amplifier"). The outphasing amplifier includes parallel amplifiers and a combiner that combines outputs of the amplifiers and that generates an output signal. The amplifiers amplify respective signals generated by splitting a signal input to the outphasing amplifier. Phase differences between the amplified signals fluctuate in accordance with an absolute value of an amplitude of the input signal.

Here, in the outphasing amplifier, in a case where a signal such as a modulation signal, whose phase and amplitude fluctuate, is input as the input signal, a phase of the input signal is inverted 180 degrees at a point of time when the absolute value of the amplitude of the input signal becomes a minimum. Therefore, in the outphasing amplifier, control is performed in which phases of the signals amplified by the amplifiers are inverted 180 degrees in accordance with the point of time when the absolute value of the amplitude of the input signal becomes a minimum.

A technology of the related art is disclosed in Japanese Laid-open Patent Publication No. 2013-225827.

SUMMARY

According to an aspect of the invention, an amplifying device includes: a signal splitter configured to split an input signal to a plurality of signals having a phase difference between the plurality of signals fluctuating in accordance with an absolute value of an amplitude of the input signal; a plurality of amplifiers configured to amplify the plurality of signals respectively; a combiner configured to combine a plurality of signals amplified by the plurality of amplifiers to generate an output signal; a selector configured to select one of the output signal whose phase is inverted and the output signal whose phase is non-inverted; and a switch controller configured to control the signal splitter so that phases of the plurality of signals are non-inverted, and to control the selector so that the selector selects one of the output signal whose phase is inverted and the output signal whose phase is non-inverted, in accordance with a first point of time when the absolute value of the amplitude of the input signal becomes a minimum or a second point of time deviated from the first point of time by a predetermined time period.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the related art of an amplifying device based on an outphasing method, to suppress a distortion of an output signal, due to discontinuity of a phase of an amplified signal, is not considered.

In other words, in the related art, phases of signals amplified by amplifiers are inverted 180 degrees in accordance with a point of time when an absolute value of an amplitude of an input signal becomes a minimum. Therefore, the amplified signals each turn out to have a portion in which a phase thereof is discontinuous. If a signal having a portion in which a phase thereof is discontinuous is amplified by an amplifier, a generated output signal is deteriorated in a case where the outputs of the amplifiers are combined. Therefore, a distortion of the output signal is generated.

Hereinafter, embodiments of an amplifying device that suppresses a distortion of an output signal, due to discontinuity of a phase of an amplified signal, will be described in detail, based on drawings. Note that an amplifying device disclosed in the present application is not limited by the following embodiments.

Figure 1:
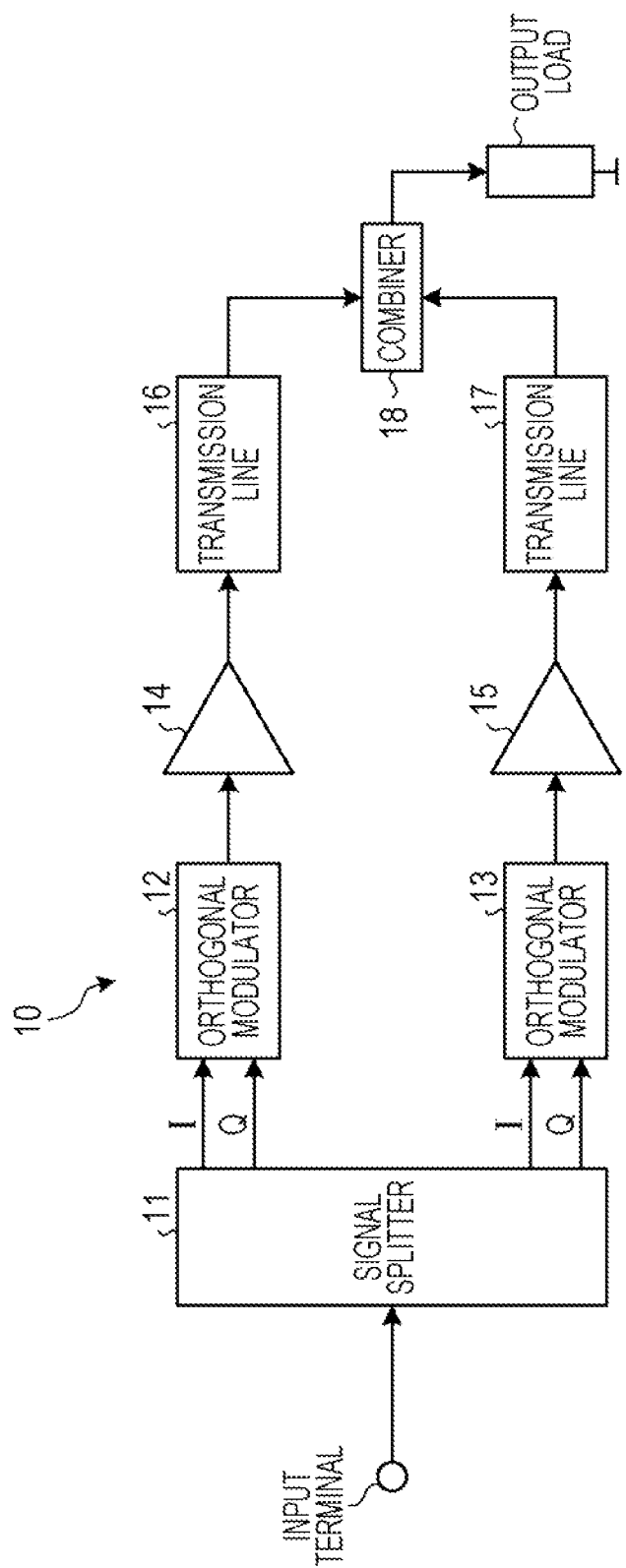
FIG. 1 is a diagram illustrating an example of a configuration of an amplifying device based on an outphasing method.

First, an amplifying device, which is based on an outphasing method and serves as a premise of the amplifying device disclosed in the present application, will be described with reference to FIG. 1 to FIG. 6. FIG. 1 is a diagram illustrating an example of a configuration of the amplifying device based on the outphasing method. Note that, in what follows, the amplifying device based on the outphasing method is called an "outphasing amplifier".

As illustrated in FIG. 1, an outphasing amplifier 10 of the technical premise includes a signal splitter 11, orthogonal modulators 12 and 13, amplifiers 14 and 15, transmission lines 16 and 17, and a combiner 18. Note that while an example, in which two combinations of an orthogonal modulator, an amplifier, and a transmission line exist, is illustrated in FIG. 1, three or more combinations thereof may exist.

The signal splitter 11 splits an input signal input from an input terminal, thereby generating a first signal and a second signal. Each of the first signal and the second signal is an I-Q signal expressed in orthogonal coordinates. Here, the input signal input to the signal splitter 11 is a signal such as a modulation signal, whose phase and amplitude fluctuate. Therefore, the signal splitter 11 generates the first signal and the second signal, a phase difference between which fluctuates in accordance with an absolute value of an amplitude of the input signal. The generated first signal and second signal are, for example, fixed envelope signals having a phase difference therebetween that fluctuates in accordance with the absolute value of the amplitude of the input signal.

Using a predetermined carrier wave signal, the orthogonal modulator 12 modulates, into an RF signal, the first signal output by the signal splitter 11 and outputs, to the amplifier 14, the first signal modulated into the RF signal. Using a predetermined carrier wave signal, the orthogonal modulator 13 modulates, into an RF signal, the second signal output by the signal splitter 11 and outputs, to the amplifier 15, the second signal modulated into the RF signal.

The amplifier 14 amplifies the first signal output by the orthogonal modulator 12 and outputs the amplified first signal to the transmission line 16. The amplifier 15 amplifies the second signal output by the orthogonal modulator 13 and outputs the amplified second signal to the transmission line 17.

The transmission line 16 and the transmission line 17 are lines used for adjusting, in the combiner 18, a phase of an output signal of the amplifier 14 and a phase of an output signal of the amplifier 15 to predetermined phases. The transmission line 16 and the transmission line 17 are generally different in line length from each other. In the example of FIG. 1, the line length of the transmission line 17 is longer than the line length of the transmission line 16.

The combiner 18 combines the output of the amplifier 14 and the output of the amplifier 15, thereby generating an output signal, and outputs the generated output signal from an output load to the outside of the outphasing amplifier 10.

Figure 2:
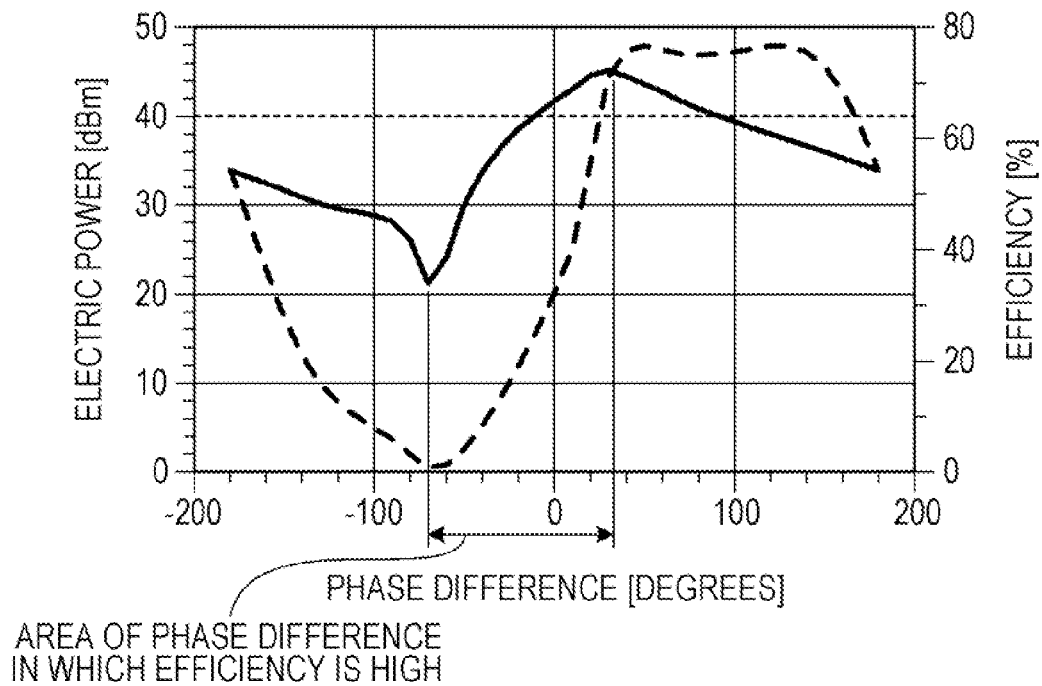
FIG. 2 is a diagram illustrating an example of a relationship among a phase difference between a first signal and a second signal, electric power of an output signal, and an amplification efficiency.

Next, a fluctuation range of the phase difference between the first signal and second signal output by the signal splitter 11 will be described. FIG. 2 is a diagram illustrating an example of a relationship among the phase difference between the first signal and the second signal, electric power of the output signal, and an amplification efficiency. In FIG. 2, a horizontal axis indicates the phase difference [degrees] between the first signal and the second signal, a left-hand vertical axis indicates the electric power [dBm] of an output signal output from the output load, and a right-hand vertical axis indicates an amplification efficiency [%] of the outphasing amplifier 10. In addition, in FIG. 2, a solid curved line is a graph illustrating transition of the electric power of the output signal output to the output load, and a dashed curved line is a graph illustrating transition of the amplification efficiency of the outphasing amplifier 10.

As illustrated in FIG. 2, in the outphasing amplifier 10, two phase differences between the first signal and the second signal, which correspond to the same electric power of the output signal, exist. Two amplification efficiencies corresponding to the respective phase differences are different. Therefore, in the outphasing amplifier 10, in order to obtain a higher amplification efficiency, the signal splitter 11 restricts a range of the fluctuation of the phase difference between the first signal and the second signal.

A case of using, for example, 40 dBm as the electric power of the output signal is assumed. In this case, in the example of FIG. 2, −20 degrees and 90 degrees may be adopted as the phase difference between the first signal and the second signal. The amplification efficiency corresponding to the phase difference of −20 degrees is 20%, and the amplification efficiency corresponding to the phase difference of 90 degrees is 75%. In view of obtaining a higher amplification efficiency, it is desirable that the phase difference between the first signal and the second signal fluctuates in a range including 90 degrees. Accordingly, the signal splitter 11 generates the first signal and the second signal so that the phase difference between the first signal and the second signal fluctuates in a range including 90 degrees in accordance with the absolute value of the amplitude of the input signal. If FIG. 2 is referenced, the range including 90 degrees corresponds to, for example, a range from 30 degrees to 180 degrees and a range from −180 degrees to −70 degrees.

Figure 3:
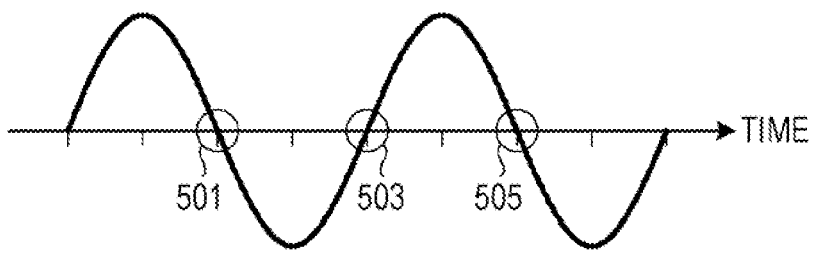
FIG. 3 is a diagram illustrating an example of a waveform of an input signal.

Next, an operation of the outphasing amplifier 10 in a case where the input signal is input will be described. First, a waveform of the input signal will be described. FIG. 3 is a diagram illustrating an example of the waveform of the input signal. In FIG. 3, a horizontal axis indicates time and a vertical axis indicates amplitudes. In what follows, the absolute value of the amplitude is called an "amplitude value", and a point of time when the amplitude value of the input signal becomes "0" is called an "amplitude zero point".

As illustrated in FIG. 3, the input signal is a signal whose phase and amplitude fluctuate. In addition, the amplitude value of the input signal becomes a minimum, "0", at a point of time 501, a point of time 503, and a point of time 505. In other words, the point of time 501, the point of time 503, and the point of time 505 correspond to the amplitude zero points. The phase of the input signal is inverted 180 degrees at the amplitude zero points. In the outphasing amplifier 10, control in which the phases of the first signal and second signal amplified by the amplifiers 14 and 15, respectively, are inverted 180 degrees in accordance with the amplitude zero points is performed. Hereinafter, operations of the outphasing amplifier 10 before and after the amplitude zero point of the input signal arrives will be described using FIG. 4A and FIG. 4B.

Figure 4A:
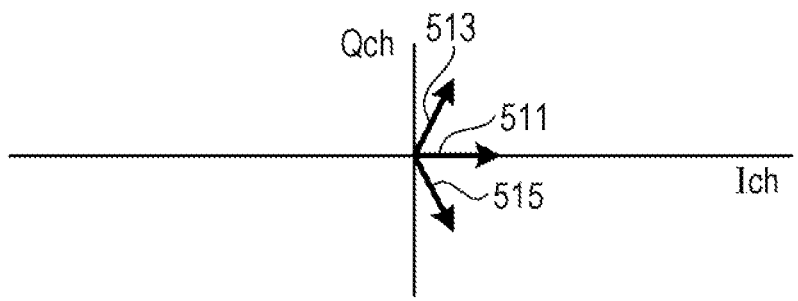
FIG. 4A is a diagram illustrating constellations of the input signal, the first signal, and the second signal before an amplitude zero point of the signal input to an outphasing amplifier of a technical premise arrives.
Figure 4B:
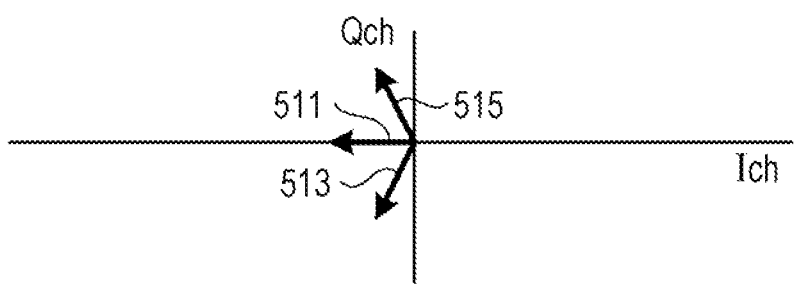
FIG. 4B is a diagram illustrating the constellations of the input signal, the first signal, and the second signal after the amplitude zero point of the signal input to the outphasing amplifier of the technical premise arrives.

FIG. 4A is a diagram illustrating constellations of the input signal, the first signal, and the second signal before the amplitude zero point of the signal input to the outphasing amplifier of a technical premise arrives. FIG. 4B is a diagram illustrating the constellations of the input signal, the first signal, and the second signal after the amplitude zero point of the signal input to the outphasing amplifier of the technical premise arrives. The constellation indicates a signal plotted on two-dimensional coordinates. In each of FIG. 4A and FIG. 4B, a horizontal axis indicates an I component, and a vertical axis indicates a Q component. In addition, in FIG. 4A and FIG. 4B, for the sake of explanation, points corresponding to signals are expressed by arrows. The input signal input to the signal splitter 11 is expressed by an arrow 511. In addition, the first signal and second signal output by the signal splitter 11 are expressed by an arrow 513 and an arrow 515, respectively.

As described above, the phase of the input signal is inverted 180 degrees at the amplitude zero point. In the outphasing amplifier 10, as illustrated in FIG. 4A and FIG.

4B, the signal splitter 11 inverts the phases of the first signal and the second signal 180 degrees in accordance with the amplitude zero point.

Figure 5:
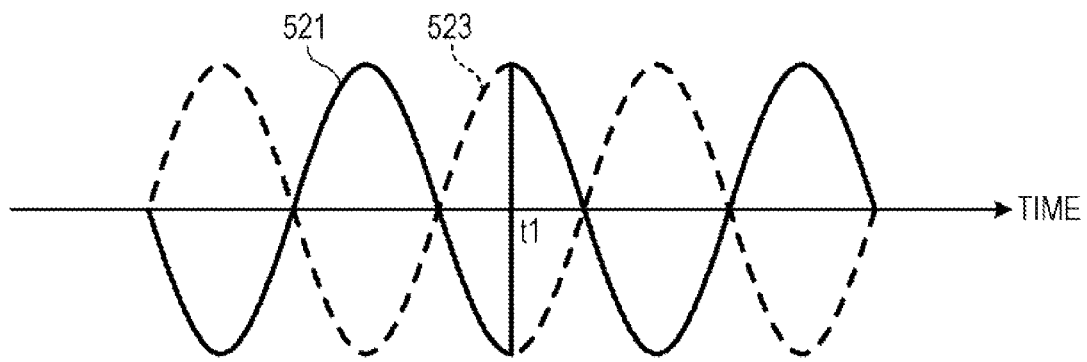
FIG. 5 is a diagram illustrating examples of waveforms of the first signal and the second signal output by a signal splitter in the technical premise.

Next, a problem point in a case of inverting the phases of the first signal and the second signal 180 degrees in accordance with the amplitude zero point will be described. FIG. 5 is a diagram illustrating examples of waveforms of the first signal and the second signal output by the signal splitter in the technical premise. In FIG. 5, a horizontal axis indicates time. The amplitude zero point is expressed by a point of time t1. The first signal output by the signal splitter 11 is a signal 521 expressed by a solid line. The second signal output by the signal splitter 11 is a signal 523 expressed by a dashed line. As illustrated in FIG. 5, the phases of the first signal and second signal output by the signal splitter 11 are inverted in accordance with the amplitude zero point (the point of time t1). In addition, the first signal and second signal whose phases are inverted are amplified by the amplifiers 14 and 15, respectively. In other words, the first signal and second signal amplified by the amplifiers 14 and 15, respectively, each have a portion in which a phase thereof is discontinuous. If the first signal and second signal each having a portion in which a phase thereof is discontinuous are amplified by the amplifiers 14 and 15, respectively, generated output signals are deteriorated in a case where the outputs of the amplifiers 14 and 15 are combined. Therefore, distortions of the output signals are generated.

Figure 6:
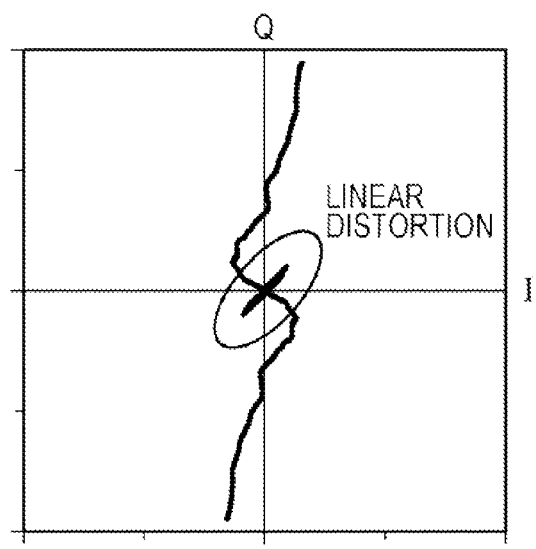
FIG. 6 is a diagram illustrating a constellation of a signal output by the outphasing amplifier of the technical premise.

FIG. 6 is a diagram illustrating a constellation of a signal output by the outphasing amplifier of the technical premise. In FIG. 6, a horizontal axis indicates the I component, and a vertical axis indicates the Q component. As illustrated in FIG. 6, a linear distortion is generated in the output signal output by the outphasing amplifier 10.

In this way, in the outphasing amplifier 10 of the technical premise, in accordance with the amplitude zero point, the phases of the signals amplified by the respective amplifiers are inverted 180 degrees. Therefore, a distortion is generated in the output signal, and it is difficult to suppress deterioration of the output signal. Therefore, in the following embodiments, an amplifying device that suppresses the distortion of the output signal, due to the discontinuity of the phases of the amplified signals, is provided.

First Embodiment

Figure 7:
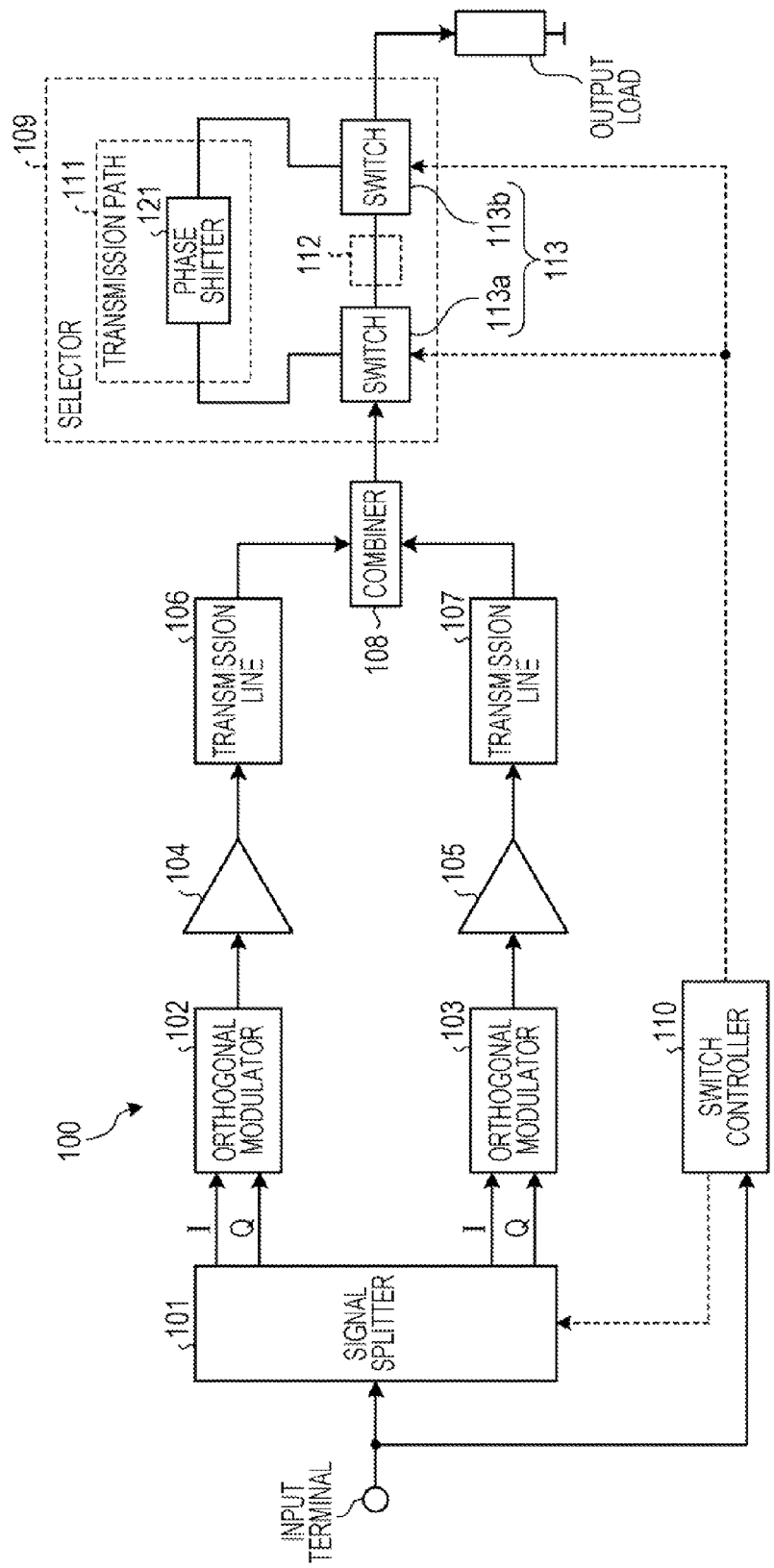
FIG. 7 is a diagram illustrating an example of a configuration of an amplifying device of a first embodiment.

FIG. 7 is a diagram illustrating an example of a configuration of an amplifying device of a first embodiment. As illustrated in FIG. 7, an amplifying device 100 includes a signal splitter 101, orthogonal modulators 102 and 103, amplifiers 104 and 105, transmission lines 106 and 107, a combiner 108, a selector 109, and a switch controller 110. Note that while an example, in which two combinations of an orthogonal modulator, an amplifier, and a transmission line exist, is illustrated in FIG. 7, three or more combinations thereof may exist.

The amplifying device 100 has basically the same configuration as that of the outphasing amplifier 10 illustrated in FIG. 1. Accordingly, a reference symbol whose tail end is a same is assigned to a same configuration element, and the detailed description thereof will be omitted.

Specifically, the signal splitter 101, the orthogonal modulators 102 and 103, and the amplifiers 104 and 105 in the first embodiment correspond to the signal splitter 11, the orthogonal modulators 12 and 13, and the amplifiers 14 and 15, respectively, illustrated in FIG. 1. In addition, the transmission lines 106 and 107 and the combiner 108 correspond to the transmission lines 16 and 17 and the combiner 18, respectively, illustrated in FIG. 1.

Hereinafter, differences between the amplifying device 100 according to the first embodiment and the outphasing amplifier 10 of the technical premise will be described.

In a case of receiving, from the switch controller 110, a phase-non-inversion instruction to be described later, the signal splitter 101 in the amplifying device 100 does not invert the phases of the first signal and the second signal 180 degrees even if the amplitude zero point arrives.

The combiner 108 combines the output of the amplifier 104 and the output of the amplifier 105, thereby generating an output signal, and outputs the generated output signal to the selector 109.

The selector 109 selects one of the output signal whose phase is inverted and the output signal whose phase is non-inverted, and the selector 109 outputs the selected output signal from an output load to the outside of the amplifying device 100. Specifically, the selector 109 includes transmission paths 111 and 112 and the switch 113.

The transmission path 111 includes a phase shifter 121. The transmission path 112 includes no phase shifter. The transmission paths 111 and 112 are connected between switches 113a and 113b of the switch 113 respectively and arranged in parallel with each other. The transmission paths 111 and 112 correspond to examples of a first path and a second path, respectively.

The phase shifter 121 is a phase shifter that shifts the phase of the input signal by $180 \times (2n-1)$ degrees (in this regard, however, "n" is a positive integer), thereby inverting the phase of the signal 180 degrees. The phase shifter 121 is, for example, a transmission line whose line length is $\lambda/2 \times (2n-1)$ (in this regard, however, "$\lambda$" is the wavelength of the input signal, and "n" is a positive integer).

The switch 113 is a switch that switches a connection destination of the combiner 108 to the transmission path 111 or the transmission path 112. Switching between the transmission path 111 and the transmission path 112 in the switch 113 is controlled by the switch controller 110 to be described later. In a case where the connection destination of the combiner 108 is switched to the transmission path 111, the switch 113 causes the output signal, whose phase is inverted by the phase shifter 121 due to passing of the output signal through the transmission path 111, to be output from the transmission path 111 to the output load. In addition, in a case where the connection destination of the combiner 108 is switched to the transmission path 112, the switch 113 causes the output signal, whose phase is non-inverted due to passing of the output signal through the transmission path 112, to be output from the transmission path 112 to the output load.

Figure 8:
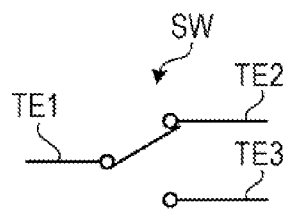
FIG. 8 is a diagram illustrating an example of a configuration of a switch.

The switch 113 includes a switch 113a, arranged in a connection portion between a start point of the transmission path 111 and a start point of the transmission path 112, and a switch 113b, arranged in a connection portion between an end point of the transmission path 111 and an end point of the transmission path 112. As each of the switch 113a and the switch 113b, such a switch SW as illustrated in FIG. 8 may be used. FIG. 8 is a diagram illustrating an example of a configuration of a switch. As illustrated in FIG. 8, the switch SW is a switch in which a terminal TE1 thereof is used in common and one of terminals TE2 and TE3 is selectable. If the switch SW is the switch 113a, the terminal TE1 is connected to the combiner 108, the terminal TE2 is connected to the start point of the transmission path 111, and the terminal TE3 is connected to the start point of the transmission path 112. If the switch SW is the switch 113b, the terminal TE1 is connected to the output load, the terminal TE2 is connected to the end point of the transmission path 111, and the terminal TE3 is connected to the end point of the transmission path 112. In a case where the connection destination of the combiner 108 is switched to the transmission path 111, the terminal TE2 is selected as the connection destination of the terminal TE1 of the switch 113a, and the terminal TE2 is selected as the connection destination of the terminal TE1 of the switch 113b. In a case where the connection destination of the combiner 108 is switched to the transmission path 112, the terminal TE3 is selected as the connection destination of the terminal TE1 of the switch 113a, and the terminal TE3 is selected as the connection destination of the terminal TE1 of the switch 113b.

Figure 9:
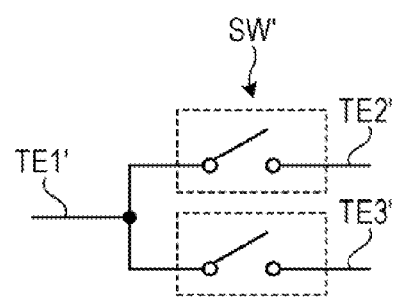
FIG. 9 is a diagram illustrating another example of the configuration of the switch.

Note that such a switch SW' as illustrated in FIG. 9 may be used as each of the switch 113a and the switch 113b. FIG. 9 is a diagram illustrating another example of the configuration of the switch. As illustrated in FIG. 9, the switch SW' is a switch in which a terminal TE1' thereof is used in common and the terminal TE1' is connected to terminals TE2' and TE3' by using on-off switches. If the switch SW' is the switch 113a, the terminal TE1' is connected to the combiner 108, the terminal TE2' is connected to the start point of the transmission path 111, and the terminal TE3' is connected to the start point of the transmission path 112. If the switch SW' is the switch 113b, the terminal TE1' s connected to the output load, the terminal TE2' is connected to the end point of the transmission path 111, and the terminal TE3' is connected to the end point of the transmission path 112. In a case where the connection destination of the combiner 108 is switched to the transmission path 111, a connection between the terminal TE1' and the terminal TE2' of the switch 113a is set to "turn-on", and a connection between the terminal TE1' and the terminal TE2' of the switch 113b is set to "turn-on". In a case where the connection destination of the combiner 108 is switched to the transmission path 112, a connection between the terminal TE1' and the terminal TE3' of the switch 113a is set to "turn-on", and a connection between the terminal TE1' and the terminal TE3' of the switch 113b is set to "turn-on".

In accordance with the amplitude zero point of the input signal, the switch controller 110 switches the output signal, selected by the selector 109, in a state in which the phases of the first signal and second signal output by the signal splitter 101 are non-inverted. Specifically, upon receiving the input signal, the switch controller 110 acquires the waveform of the input signal. The switch controller 110 analyzes the acquired waveform, and in a case where the amplitude zero point arrives, the switch controller 110 outputs, to the signal splitter 101, a phase-non-inversion instruction that instructs the signal splitter 101 to non-invert the phases of the first signal and the second signal. In addition, the switch controller 110 outputs the phase-non-inversion instruction and controls switching between the transmission path 111 and the transmission path 112 in the switch 113. From this, even in a case where the amplitude zero point of the input signal arrives, the phases of the first signal and second signal output by the signal splitter 101 are non-inverted, and the first signal and the second signal each becomes a smooth signal having no discontinuous portion in the phase thereof. The waveforms of these first signal and second signal are expressed as in FIG. 10.

Figure 10:
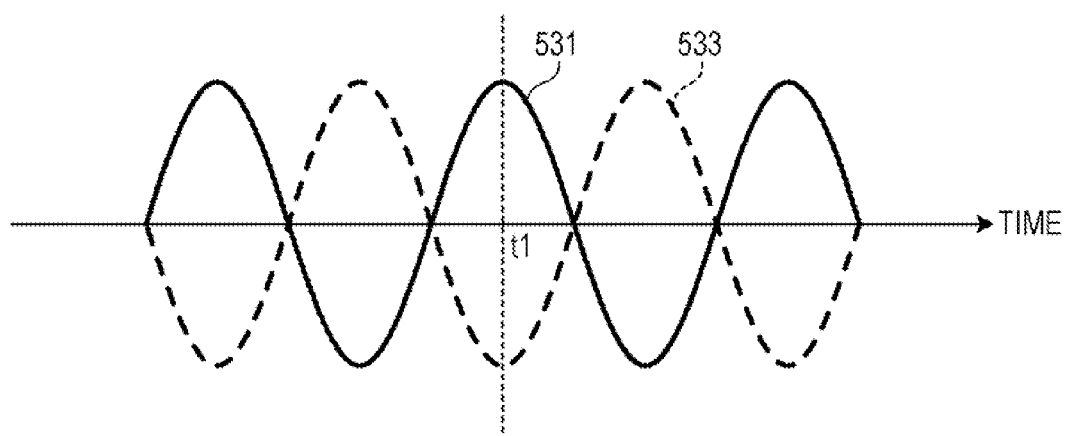
FIG. 10 is a diagram illustrating examples of waveforms of a first signal and a second signal output by a signal splitter in the first embodiment.

FIG. 10 is a diagram illustrating examples of waveforms of a first signal and a second signal output by a signal splitter in the first embodiment. In FIG. 10, a horizontal axis indicates time and a vertical axis indicates amplitudes. The amplitude zero point is expressed by a point of time t1. The first signal output by the signal splitter 101 is a signal 531 expressed by a solid line. The second signal output by the signal splitter 101 is a signal 533 expressed by a dashed line. As illustrated in FIG. 10, the phases of the first signal and second signal output by the signal splitter 101 are non-inverted even in a case where the amplitude zero point (the point of time t1) arrives. In other words, the first signal and second signal output by the signal splitter 101 are signals each having no discontinuous portion in the phase thereof.

Next, operations of the amplifying device 100 before and after the amplitude zero point of the input signal arrives will be described.

Figure 11A:
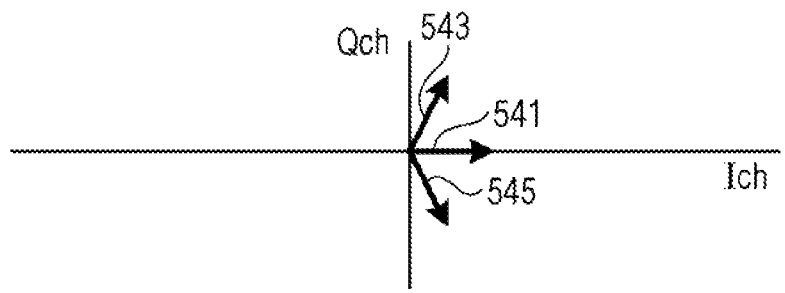
FIG. 11A is a diagram illustrating constellations of an input signal, the first signal, and the second signal before an amplitude zero point of the signal input to the amplifying device of the first embodiment arrives.
Figure 11B:
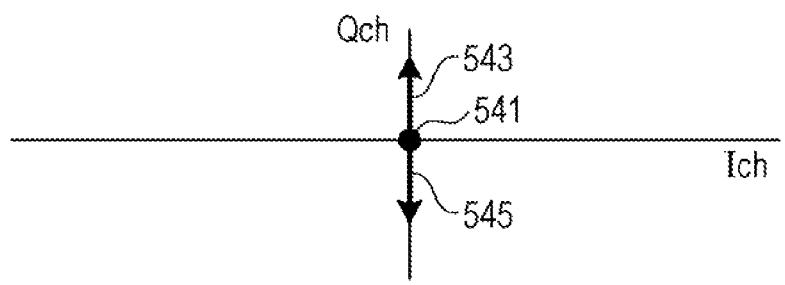
FIG. 11B is a diagram illustrating the constellations of the input signal, the first signal, and the second signal in a case where the amplitude zero point of the signal input to the amplifying device of the first embodiment arrives.
Figure 11C:
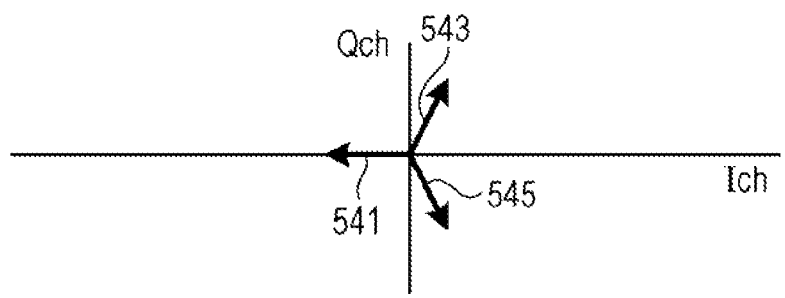
FIG. 11C is a diagram illustrating the constellations of the input signal, the first signal, and the second signal after the amplitude zero point of the signal input to the amplifying device of the first embodiment arrives.

FIG. 11A is a diagram illustrating constellations of the input signal, the first signal, and the second signal before an amplitude zero point of the signal input to the amplifying device of the first embodiment arrives. FIG. 11B is a diagram illustrating the constellations of the input signal, the first signal, and the second signal in a case where the amplitude zero point of the signal input to the amplifying device of the first embodiment arrives. FIG. 11C is a diagram illustrating the constellations of the input signal, the first signal, and the second signal after the amplitude zero point of the signal input to the amplifying device of the first embodiment arrives. In each of FIG. 11A to FIG. 11C, a horizontal axis indicates an I component, and a vertical axis indicates a Q component. In addition, in FIG. 11A to FIG. 11C, for the sake of explanation, points corresponding to signals are expressed by arrows. The input signal input to the signal splitter 101 is expressed by an arrow 541. In addition, the first signal and second signal output by the signal splitter 101 are expressed by an arrow 543 and an arrow 545, respectively.

As illustrated in FIG. 11A to FIG. 11C, the phase of the input signal is inverted 180 degrees at the amplitude zero point. Here, as described above, in a case where the amplitude zero point arrives, the switch controller 110 outputs the phase-non-inversion instruction to the signal splitter 101. Therefore, the signal splitter 101 does not invert the phases of the first signal and the second signal 180 degrees. From this, as illustrated in FIG. 11A and FIG. 11B, the phases of the first signal and second signal output by the signal splitter 101 are not inverted 180 degrees even in a case where the amplitude zero point arrives.

Figure 12A:
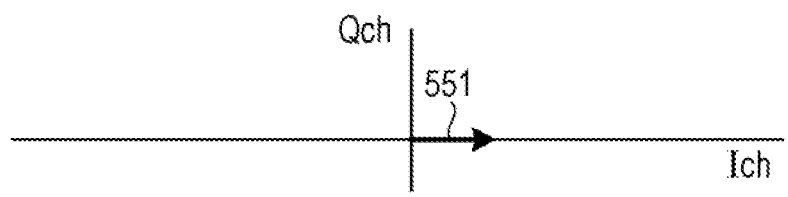
FIG. 12A is a diagram illustrating a constellation of an output signal output by a combiner before the amplitude zero point of the signal input to the amplifying device of the first embodiment arrives.
Figure 12B:
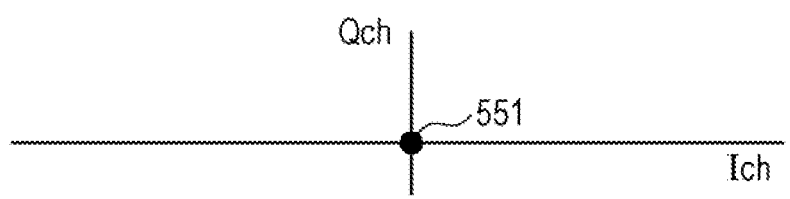
FIG. 12B is a diagram illustrating the constellation of the output signal output by the combiner in a case where the amplitude zero point of the signal input to the amplifying device of the first embodiment arrives.
Figure 12C:
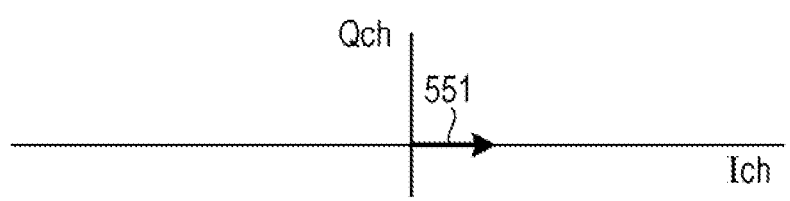
FIG. 12C is a diagram illustrating the constellation of the output signal output by the combiner after the amplitude zero point of the signal input to the amplifying device of the first embodiment arrives.

FIG. 12A is a diagram illustrating a constellation of an output signal output by a combiner before the amplitude zero point of the signal input to the amplifying device of the first embodiment arrives. FIG. 12B is a diagram illustrating the constellation of the output signal output by the combiner in a case where the amplitude zero point of the signal input to the amplifying device of the first embodiment arrives. FIG. 12C is a diagram illustrating the constellation of the output signal output by the combiner after the amplitude zero point of the signal input to the amplifying device of the first embodiment arrives. In each of FIG. 12A to FIG. 12C, a horizontal axis indicates an I component, and a vertical axis indicates a Q component. In addition, in FIG. 12A to FIG. 12C, for the sake of explanation, points corresponding to the signal are expressed by arrows. The output signal output by the combiner 108 is expressed by an arrow 551.

Even in a case where the amplitude zero point arrives, the phases of the first signal and second signal output by the signal splitter 101 are not inverted 180 degrees. In addition, the first signal and second signal whose phases are non-inverted are amplified by the amplifiers 104 and 105, respectively, and the output of the amplifier 104 and the output of the amplifier 105 are combined by the combiner 108. From this, as illustrated in FIG. 12A to FIG. 12C, the output signal output by the combiner 108 is not inverted 180 degrees even in a case where the amplitude zero point arrives.

Figure 13A:
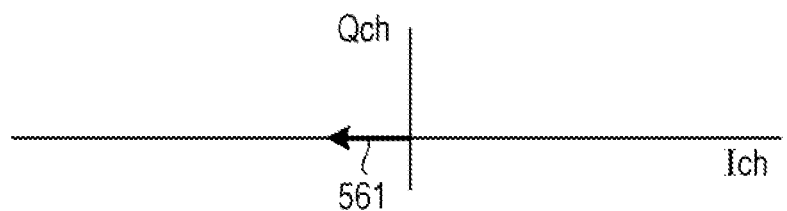
FIG. 13A is a diagram illustrating a constellation of an output signal output from a first path before the amplitude zero point of the signal input to the amplifying device of the first embodiment arrives.
Figure 13B:
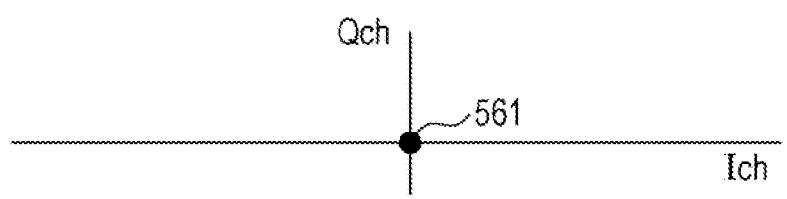
FIG. 13B is a diagram illustrating the constellation of the output signal output from the first path in a case where the amplitude zero point of the signal input to the amplifying device of the first embodiment arrives.
Figure 13C:
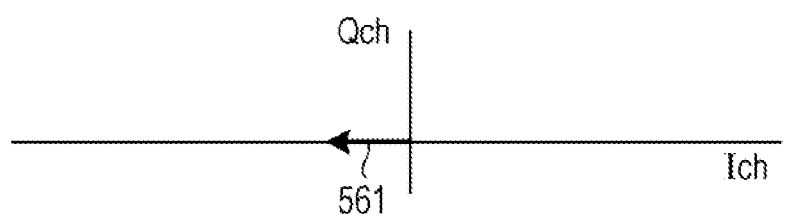
FIG. 13C is a diagram illustrating the constellation of the output signal output from the first path after the amplitude zero point of the signal input to the amplifying device of the first embodiment arrives.

FIG. 13A is a diagram illustrating a constellation of an output signal output from a first path before the amplitude zero point of the signal input to the amplifying device of the first embodiment arrives. FIG. 13B is a diagram illustrating the constellation of the output signal output from the first path in a case where the amplitude zero point of the signal input to the amplifying device of the first embodiment arrives. FIG. 13C is a diagram illustrating the constellation of the output signal output from the first path after the amplitude zero point of the signal input to the amplifying device of the first embodiment arrives.

Figure 14A:
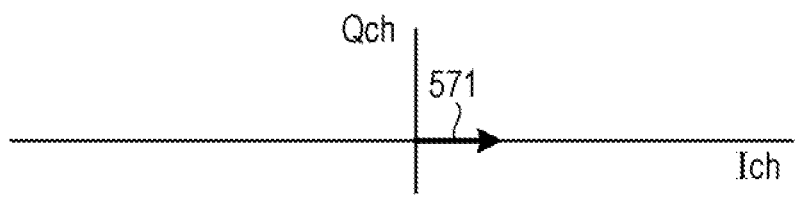
FIG. 14A is a diagram illustrating a constellation of an output signal output from a second path before the amplitude zero point of the signal input to the amplifying device of the first embodiment arrives.
Figure 14B:
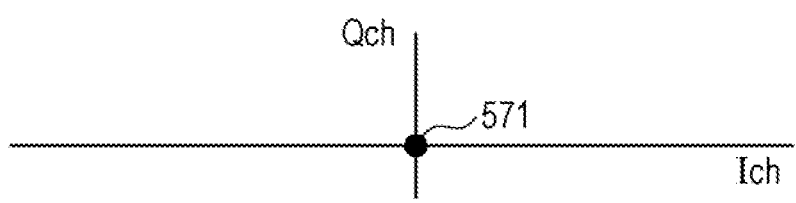
FIG. 14B is a diagram illustrating the constellation of the output signal output from the second path in a case where the amplitude zero point of the signal input to the amplifying device of the first embodiment arrives.
Figure 14C:
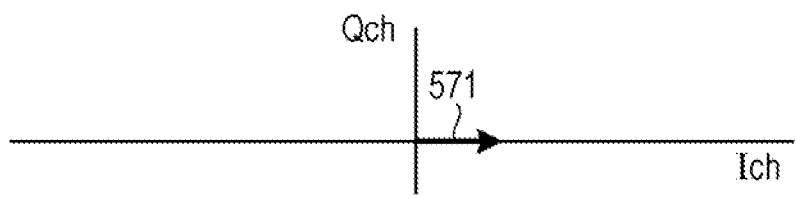
FIG. 14C is a diagram illustrating the constellation of the output signal output from the second path after the amplitude zero point of the signal input to the amplifying device of the first embodiment arrives.

FIG. 14A is a diagram illustrating a constellation of an output signal output from a second path before the amplitude zero point of the signal input to the amplifying device of the first embodiment arrives. FIG. 14B is a diagram illustrating the constellation of the output signal output from the second path in a case where the amplitude zero point of the signal input to the amplifying device of the first embodiment arrives. FIG. 14C is a diagram illustrating the constellation of the output signal output from the second path after the amplitude zero point of the signal input to the amplifying device of the first embodiment arrives. In each of FIG. 13A to FIG. 13C and FIG. 14A to FIG. 14C, a horizontal axis indicates an I component, and a vertical axis indicates a Q component. In addition, in FIG. 13A to FIG. 13C and FIG. 14A to FIG. 14C, for the sake of explanation, points corresponding to signals are expressed by arrows. In each of FIG. 13A to FIG. 13C, the output signal output from the transmission path 111 serving as the first path is expressed by an arrow 561. In each of FIG. 14A to FIG. 14C, the output signal output from the transmission path 112 serving as the second path is expressed by an arrow 571. Note that, in FIG. 13A to FIG. 13C and FIG. 14A to FIG. 14C, for the sake of explanation, it is assumed that switching between the transmission path 111 and the transmission path 112 in the switch 113 before and after the amplitude zero point of the input signal arrives is not performed.

The output signal output from the transmission path 111 is an output signal whose phase is inverted by the phase shifter 121. Therefore, as illustrated in FIG. 13A to FIG. 13C, the phase of the output signal output from the transmission path 111 is inverted 180 degrees, compared with the phase of the output signal output by the combiner 108 (the output signal illustrated in FIG. 12A to FIG. 12C).

In contrast, the output signal output from the transmission path 112 is an output signal whose phase is non-inverted. Therefore, as illustrated in FIG. 14A to FIG. 14C, the phase of the output signal output from the transmission path 112 is the same as the phase of the output signal output by the combiner 108 (the output signal illustrated in FIG. 12A to FIG. 12C).

Figure 15A:
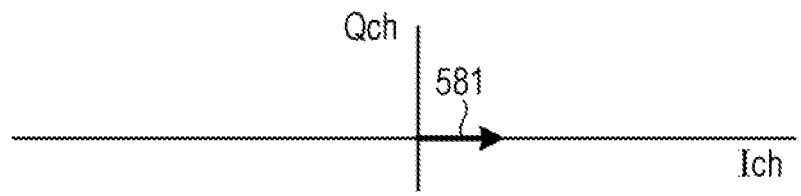
FIG. 15A is a diagram illustrating a constellation of an output signal output by a selector before the amplitude zero point of the signal input to the amplifying device of the first embodiment arrives.
Figure 15B:
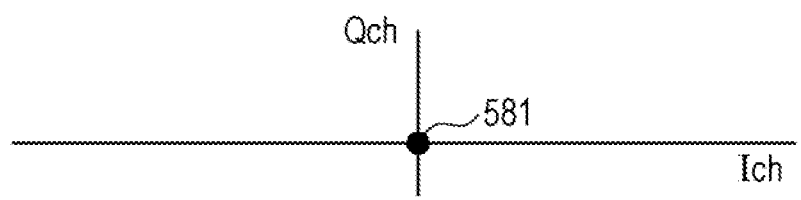
FIG. 15B is a diagram illustrating the constellation of the output signal output by the selector in a case where the amplitude zero point of the signal input to the amplifying device of the first embodiment arrives.
Figure 15C:
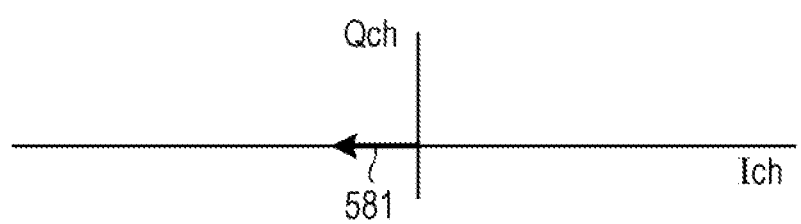
FIG. 15C is a diagram illustrating the constellation of the output signal output by the selector after the amplitude zero point of the signal input to the amplifying device of the first embodiment arrives.

FIG. 15A is a diagram illustrating a constellation of an output signal output by a selector before the amplitude zero point of the signal input to the amplifying device of the first embodiment arrives. FIG. 15B is a diagram illustrating the constellation of the output signal output by the selector in a case where the amplitude zero point of the signal input to the amplifying device of the first embodiment arrives. FIG. 15C is a diagram illustrating the constellation of the output signal output by the selector after the amplitude zero point of the signal input to the amplifying device of the first embodiment arrives. In each of FIG. 15A to FIG. 15C, a horizontal axis indicates an I component, and a vertical axis indicates a Q component. In addition, in FIG. 15A to FIG. 15C, for the sake of explanation, points corresponding to the signal are expressed by arrows. The output signal output by the selector 109 is expressed by an arrow 581.

In a case where the amplitude zero point arrives, the switch controller 110 outputs the phase-non-inversion instruction and controls switching between the transmission path 111 and the transmission path 112 in the switch 113. Specifically, in a case where the amplitude zero point arrives, the switch controller 110 performs switching from the transmission path 111 to the transmission path 112 if the connection destination of the combiner 108 is the transmission path 111, and the switch controller 110 performs switching from the transmission path 112 to the transmission path 111 if the connection destination of the combiner 108 is the transmission path 112. In other words, one of the output signal whose phase is inverted by the phase shifter 121 due to passing of the output signal through the transmission path 111 and the output signal whose phase is non-inverted due to passing of the output signal through the transmission path 112 is output by the selector 109. From this, as illustrated in FIG. 15A to FIG. 15C, in a case where the amplitude zero point arrives, the phase of the output signal output by the selector 109 is inverted 180 degrees.

Figure 16A:
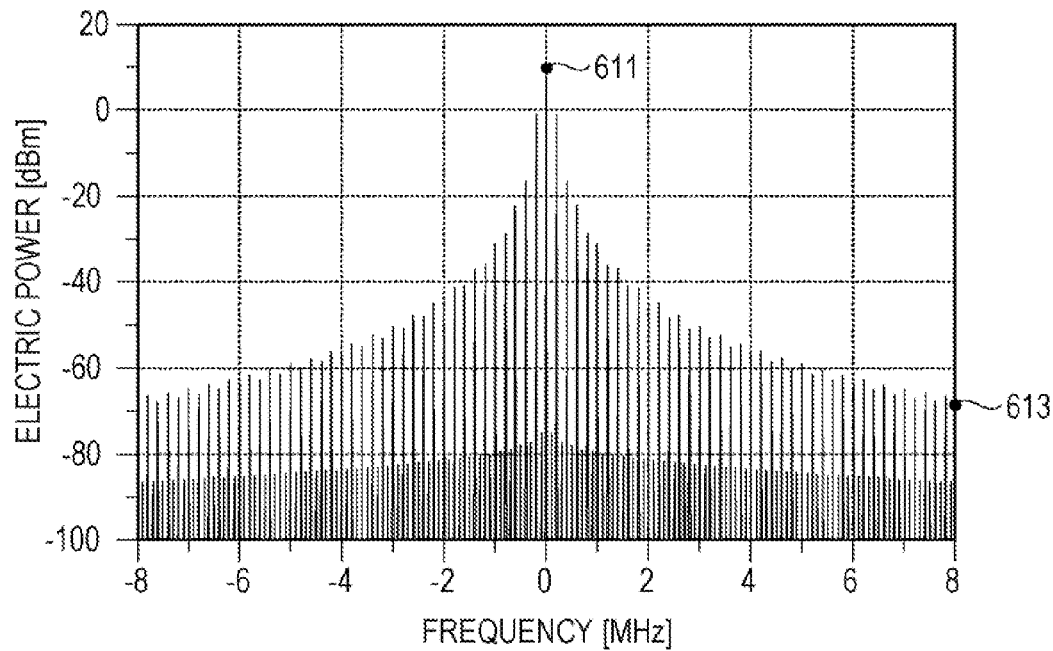
FIG. 16A is a diagram illustrating examples of spectra of the first signal and the second signal input to respective amplifiers in the amplifying device of the first embodiment.
Figure 16B:
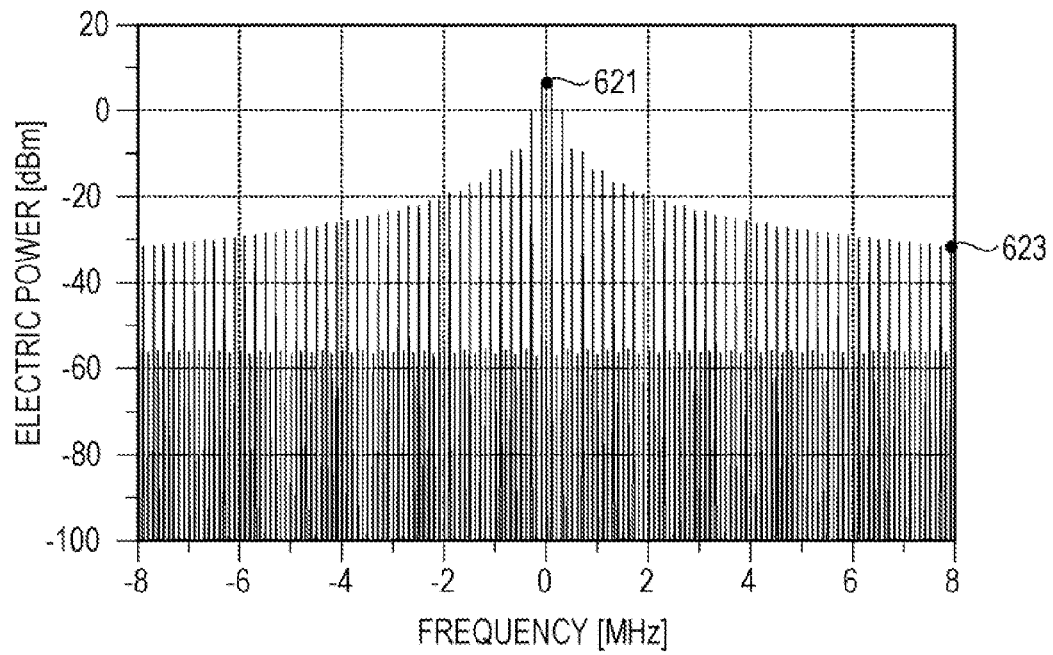
FIG. 16B is a diagram illustrating examples of spectra of the first signal and the second signal input to respective amplifiers in the outphasing amplifier of the technical premise.

FIG. 16A is a diagram illustrating examples of spectra of the first signal and the second signal input to respective amplifiers in the amplifying device of the first embodiment. FIG. 16B is a diagram illustrating examples of spectra of the first signal and the second signal input to the respective amplifiers in the outphasing amplifier of the technical premise. In each of FIG. 16A and FIG. 16B, a horizontal axis indicates a frequency, and a vertical axis indicates electric power.

In the amplifying device 100 of the first embodiment, the first signal and the second signal input to the respective amplifiers each have no discontinuous portion in the phase thereof. Therefore, as illustrated in FIG. 16A, in each of the first signal and second signal input to the respective amplifiers, noise components in a frequency band other than a center frequency having a maximum amplitude level in such a manner as a point 611 are relatively small. In the example of, for example, FIG. 16A, a noise component 613 corresponding to a frequency of 8 (MHz) is about −70 (dBm).

In contrast, in the outphasing amplifier 10 of the technical premise, the first signal and the second signal input to the respective amplifiers each have a discontinuous portion in the phase thereof. Therefore, as illustrated in FIG. 16B, in each of the first signal and second signal input to the respective amplifiers, noise components in a frequency band other than a center frequency having a maximum amplitude level in such a manner as a point 621 are relatively large. In the example of, for example, FIG. 16B, a noise component 623 corresponding to a frequency of 8 (MHz) is about −30 (dBm). In other words, in the amplifying device 100 of the first embodiment, it is possible to suppress deterioration of signals input to the respective amplifiers, compared with the outphasing amplifier 10 of the technical premise.

Figure 17:
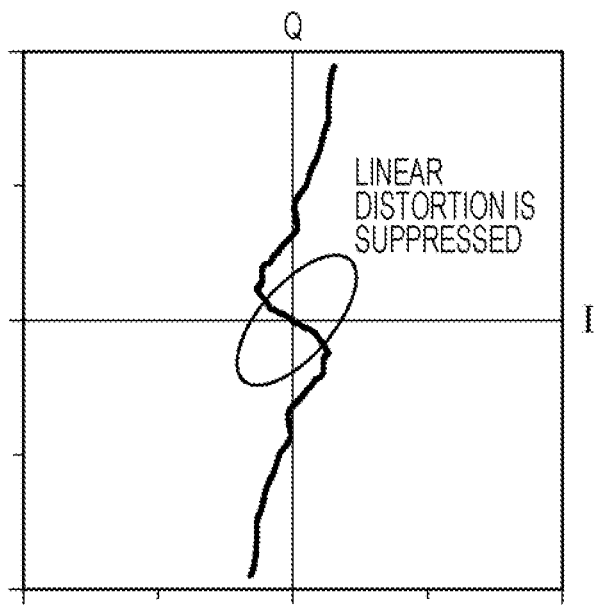
FIG. 17 is a diagram illustrating a constellation of a signal output by the amplifying device of the first embodiment.

FIG. 17 is a diagram illustrating a constellation of a signal output by the amplifying device of the first embodiment. In FIG. 17, a horizontal axis indicates an I component, and a vertical axis indicates a Q component. In the amplifying device 100, the deterioration of amplified signals is suppressed. Therefore, a linear distortion in the output signal output by the amplifying device 100 is suppressed as illustrated in FIG. 17.

Next, output processing of the output signal in the amplifying device 100 of the first embodiment will be described.

Figure 18:
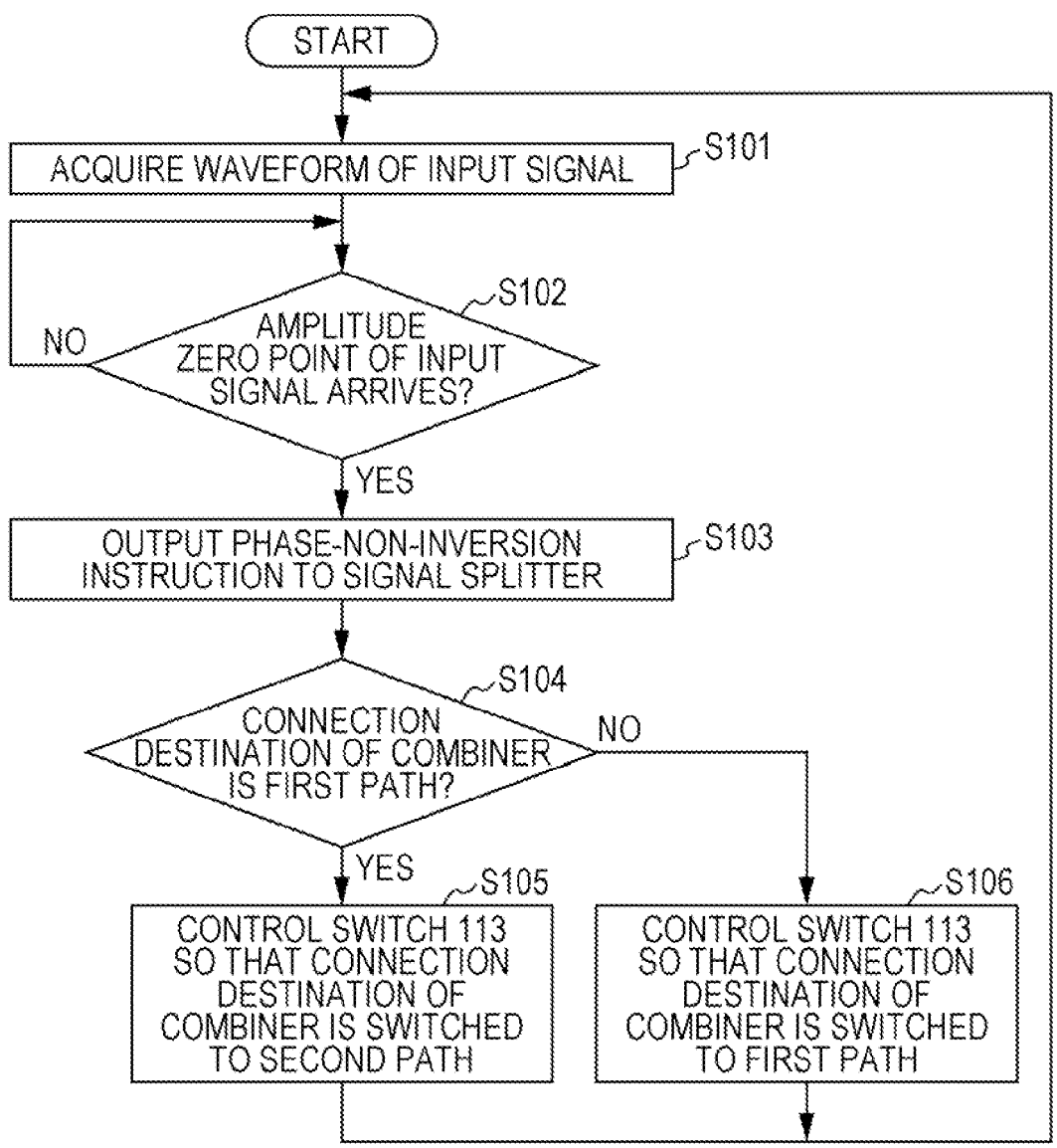
FIG. 18 is a flowchart illustrating a flow of output processing of the output signal in the amplifying device of the first embodiment.

FIG. 18 is a flowchart illustrating a flow of the output processing of the output signal in the amplifying device of the first embodiment.

As illustrated in FIG. 18, upon receiving the input signal, the switch controller 110 acquires the waveform of the input signal (operation S101). The switch controller 110 analyzes the acquired waveform, and in a case where the amplitude zero point of the input signal does not arrive, the switch controller 110 waits (operation S102: No).

In a case where the amplitude zero point of the input signal arrives (operation S102: Yes), the switch controller 110 outputs the phase-non-inversion instruction to the signal splitter 101 (operation S103). In a case of receiving the phase-non-inversion instruction from the switch controller 110, the signal splitter 101 does not invert the phases of the first signal and the second signal 180 degrees even if the amplitude zero point arrives.

In a case where the connection destination of the combiner 108 is the transmission path 111 serving as the first path (operation S104: Yes), the switch controller 110 performs the following processing. In other words, the switch controller 110 controls the switch 113 so that the connection destination of the combiner 108 is switched from the transmission path 111 to the transmission path 112 serving as the second path (operation S105). In a case where the connection destination of the combiner 108 is switched to the transmission path 112, the switch 113 causes the output signal, whose phase is non-inverted due to passing of the output signal through the transmission path 112, to be output from the transmission path 112 to the output load.

On the other hand, in a case where the connection destination of the combiner 108 is the transmission path 112 serving as the second path (operation S104: No), the switch controller 110 performs the following processing. In other words, the switch controller 110 controls the switch 113 so that the connection destination of the combiner 108 is switched from the transmission path 112 to the transmission path 111 serving as the first path (operation S106). In a case where the connection destination of the combiner 108 is switched to the transmission path 111, the switch 113 causes the output signal, whose phase is inverted by the phase shifter 121 due to passing of the output signal through the transmission path 111, to be output from the transmission path 111 to the output load.

As above, in the amplifying device 100 of the first embodiment, in accordance with the amplitude zero point of the input signal, one of the output signal whose phase is inverted and the output signal whose phase is non-Inverted is selectively output in a state in which the phases of the first signal and second signal input to the respective amplifiers are non-inverted. Therefore, even in a case where the amplitude zero point of the input signal arrives, the first signal and second signal input to the respective amplifiers each become a smooth signal having no discontinuous portion in the phase thereof. As a result, according to the first embodiment, it is possible to suppress a distortion of the output signal, due to discontinuity of the phases of amplified signals.

Figure 19:
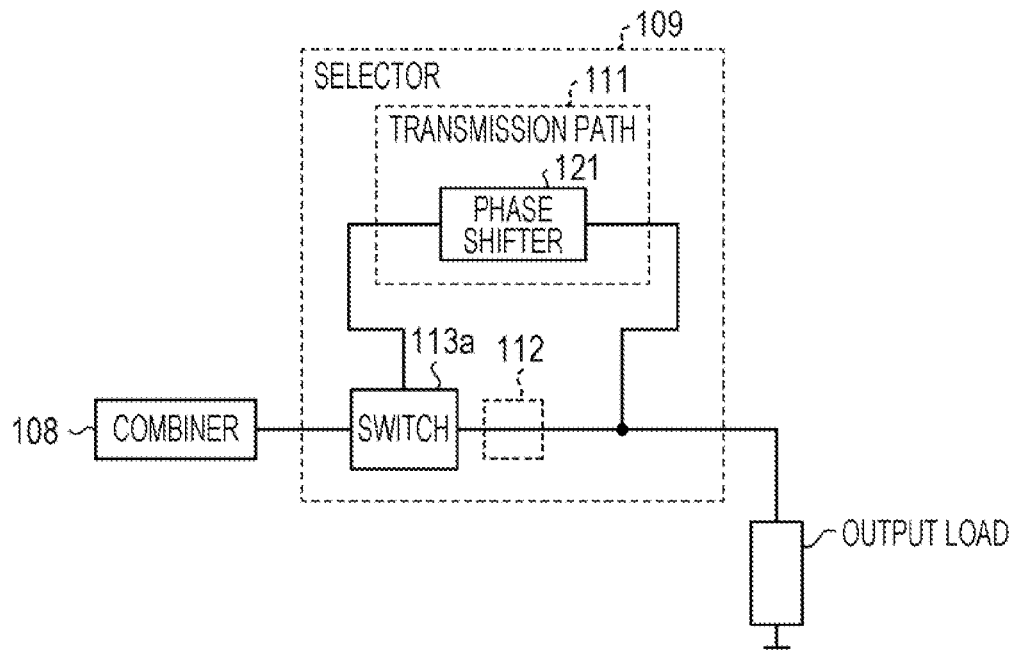
FIG. 19 is a diagram illustrating a first example of a modification to the switch in the first embodiment.

Note that while, in the above-mentioned first embodiment, an example in which the switch 113a is arranged in a connection portion between the start point of the transmission path 111 and the start point of the transmission path 112 and the switch 113b is arranged in a connection portion between the end point of the transmission path 111 and the end point of the transmission path 112 is described, the disclosed technology is not limited to this. As illustrated in, for example, FIG. 19, the switch 113b may be omitted, and the end point of the transmission path 111 and the end point of the transmission path 112 may be directly connected. FIG. 19 is a diagram illustrating a first example of a modification to the switch in the first embodiment. In the example of FIG. 19, in a case where the connection destination of the combiner 108 is switched to the transmission path 112 by the switch 113a, the phase shifter 121 in the transmission path 111 functions as an open stub for the output load.

Figure 20:
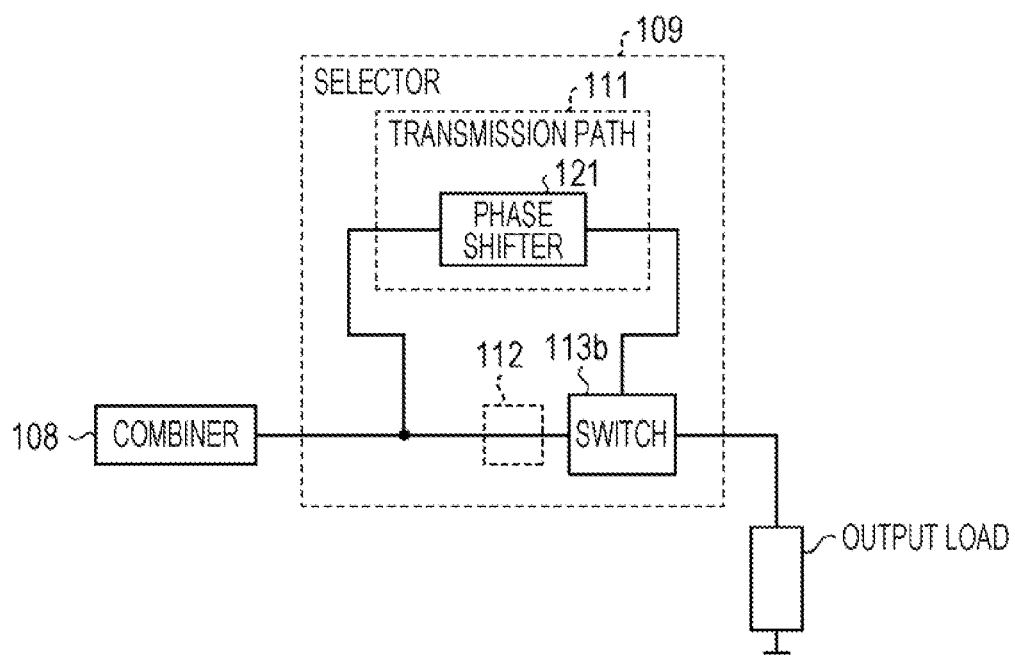
FIG. 20 is a diagram illustrating a second example of a modification to the switch in the first embodiment.

In addition, as illustrated in FIG. 20, the switch 113a may be omitted, and the start point of the transmission path 111 and the start point of the transmission path 112 may be directly connected. FIG. 20 is a diagram illustrating a second example of a modification to the switch in the first embodiment. In the example of FIG. 20, in a case where the connection destination of the combiner 108 is switched to the transmission path 112 by the switch 113b, the phase shifter 121 in the transmission path 111 functions as an open stub for the output load.

Second Embodiment

A second embodiment is different from the first embodiment in the structure of a selector and a method for switching an output signal selected by the selector. Therefore, in what follows, the structure of the selector and the method for switching the output signal selected by the selector will be mainly described.

Figure 21:
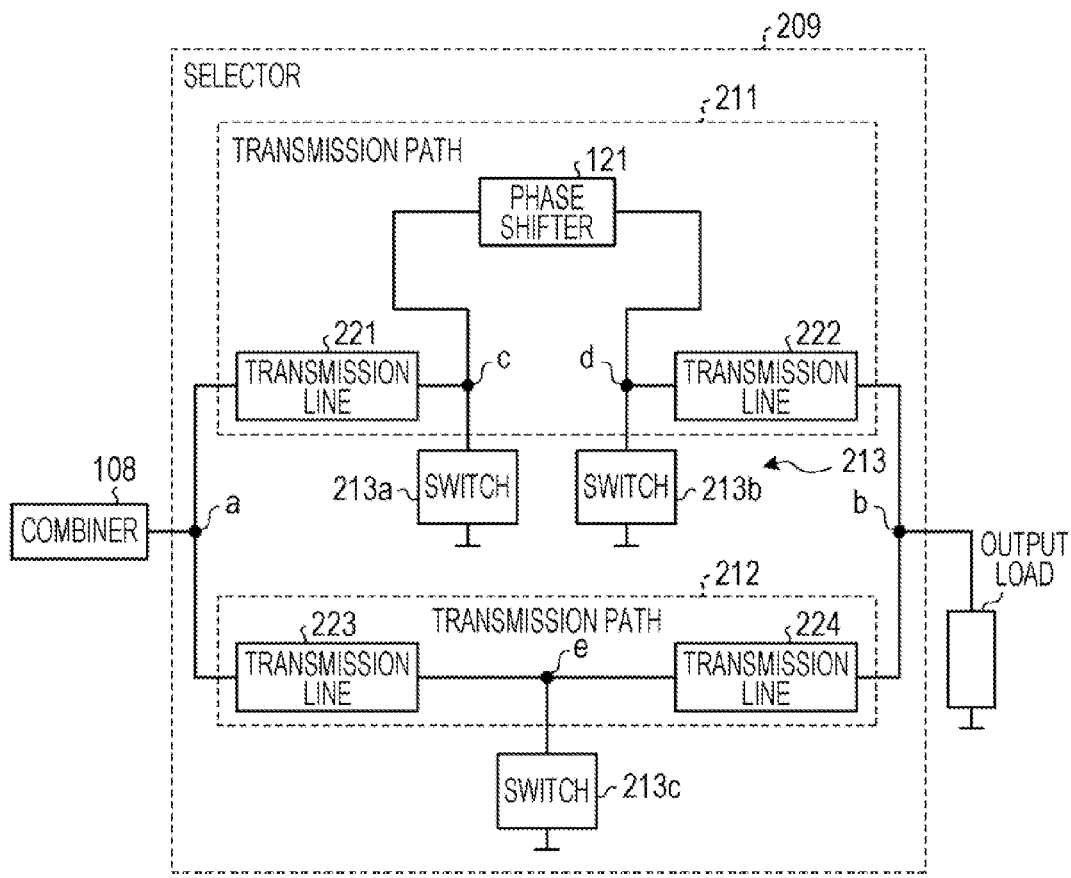
FIG. 21 is a diagram illustrating an example of a configuration of a selector in a second embodiment.

FIG. 21 is a diagram illustrating an example of the configuration of the selector in the second embodiment. Note that the entire configuration of an amplifying device of the second embodiment is illustrated in FIG. 7 in the same way as in the first embodiment. In addition, in the second embodiment, it is assumed that unless otherwise noted, individual units having the same symbols as those in the first embodiment have the same functions as those in the first embodiment.

As illustrated in FIG. 21, in the amplifying device of the second embodiment, a selector 209 includes transmission paths 211 and 212 and a switch 213.

The transmission path 211 includes the phase shifter 121 and transmission lines 221 and 222. The phase shifter 121 has the same function as that of the phase shifter 121 in the first embodiment. The transmission line 221 has a line length of $\lambda/4$ and is connected in series to an input end of the phase shifter 121. The transmission line 222 has a line length of $\lambda/4$ and is connected in series to an output end of the phase shifter 121. The transmission lines 221 and 222 correspond to examples of first and second transmission lines, respectively.

The transmission path 212 is connected in parallel to the transmission path 211 and includes no phase shifter. The transmission path 212 includes transmission lines 223 and 224. The transmission lines 223 and 224 each have a line length of $\lambda/4$ and are connected in series to each other. The transmission lines 223 and 224 correspond to examples of third and fourth transmission lines.

Note that, in what follows, it is assumed that a connection portion among the transmission line 221, the transmission line 223, and the combiner 108 is expressed as a "connection portion a" and a connection portion among the transmission line 222, the transmission line 224, and the output load is expressed as a "connection portion b". In addition, in what follows, it is assumed that a connection portion between the transmission line 221 and the input end of the phase shifter 121 is expressed as a "connection portion c" and a connection portion between the transmission line 222 and the output end of the phase shifter 121 is expressed as a "connection portion d". In addition, in what follows, it is assumed that a connection portion between the transmission line 223 and the transmission line 224 is expressed as a "connection portion e".

The switch 213 is a switch that switches the connection destination of the combiner 108 to the transmission path 211 or the transmission path 212. Switching between the transmission path 211 and the transmission path 212 in the switch 213 is controlled by the switch controller 110. In a case where the connection destination of the combiner 108 is switched to the transmission path 211, the switch 213 causes the output signal, whose phase is inverted by the phase shifter 121 due to passing of the output signal through the transmission path 211, to be output from the transmission path 211 to the output load. In addition, in a case where the connection destination of the combiner 108 is switched to the transmission path 212, the switch 213 causes the output signal, whose phase is non-inverted due to passing of the output signal through the transmission path 212, to be output from the transmission path 212 to the output load.

Figure 22:
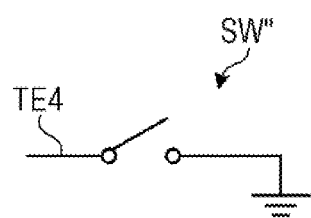
FIG. 22 is a diagram illustrating an example of a configuration of a switch.

The switch 213 includes switches 213a, 213b, and 213c. The switch 213a is a switch that switches between a connection and no connection between the connection portion c and a ground. The switch 213b is a switch that switches between a connection and no connection between the connection portion d and the ground. The switch 213c is a switch that switches between a connection and no connection between the connection portion e and the ground. The switches 213a, 213b, and 213c are examples of first to third switches, respectively. As each of the switches 213a, 213b, and 213c, such a switch SW" as illustrated in FIG. 22 may be used. FIG. 22 is a diagram illustrating an example of a configuration of a switch. As illustrated in FIG. 22, the switch SW" is a switch in which a terminal TE4 thereof and the ground are connected to each other using an on-off switch. The terminal TE4 is connected to the connection portion c, the connection portion d, or the connection portion e.

In addition, in the amplifying device of the second embodiment, in accordance with the amplitude zero point of the input signal, the switch controller 110 switches the output signal, selected by the selector 209, in a state in which the phases of the first signal and second signal output by the signal splitter 101 are non-inverted. Specifically, upon receiving the input signal, the switch controller 110 acquires the waveform of the input signal. The switch controller 110 analyzes the acquired waveform, and in a case where the amplitude zero point arrives, the switch controller 110 outputs, to the signal splitter 101, a phase-non-inversion instruction that instructs the signal splitter 101 to non-invert the phases of the first signal and the second signal. In addition, the switch controller 110 outputs the phase-non-inversion instruction and controls switching between the transmission path 211 and the transmission path 212 in the switch 213. From this, even in a case where the amplitude zero point of the input signal arrives, the phases of the first signal and second signal output by the signal splitter 101 are non-inverted, and the first signal and the second signal each become a smooth signal having no discontinuous portion in the phase thereof.

Figure 23:
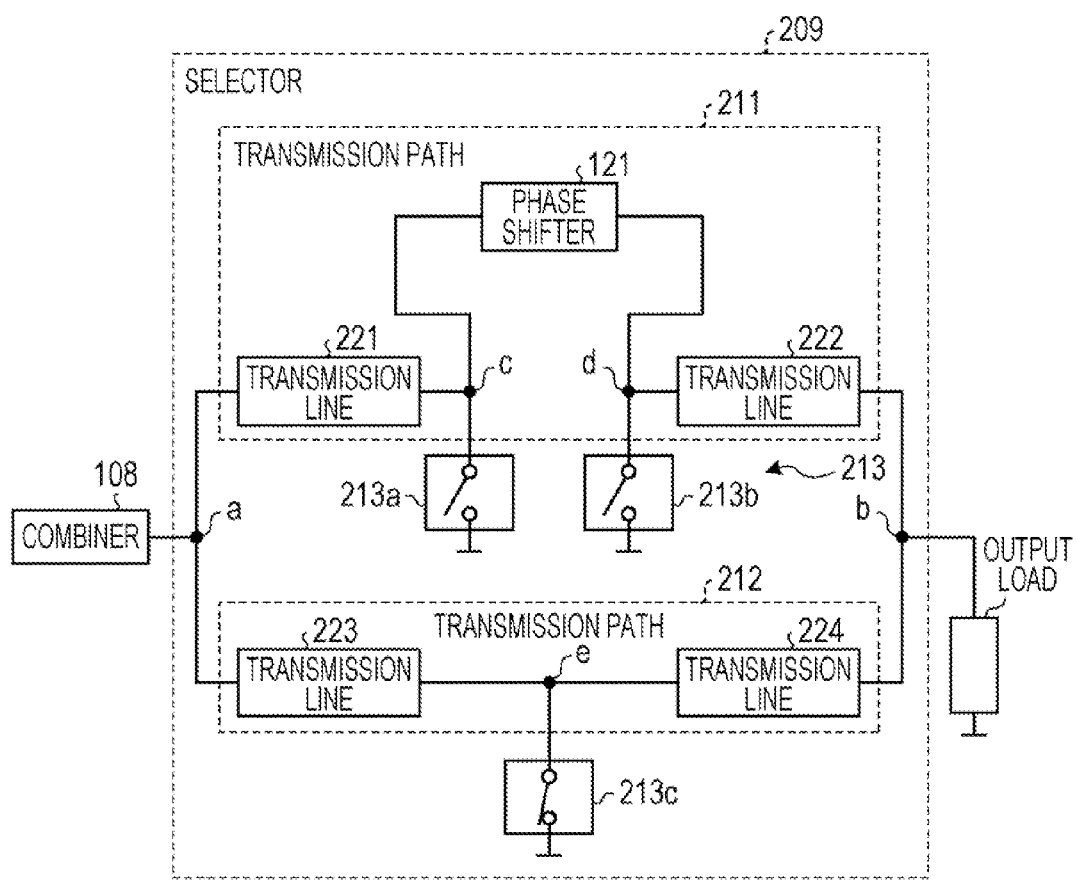
FIG. 23 is a diagram for explaining an example of processing in which a switch controller switches a connection destination of a combiner to a first path.

Here, processing in which the switch controller 110 controls switching between the transmission path 211 and the transmission path 212 in the switch 213 will be further described in detail. First, a case where the switch controller 110 switches the connection destination of the combiner 108 to the transmission path 211 serving as the first path will be described. FIG. 23 is a diagram for explaining an example of processing in which a switch controller switches a connection destination of a combiner to the first path. As illustrated in FIG. 23, the switch controller 110 sets the switch 213a and the switch 213b to no connections and sets the switch 213c to a connection, thereby switching the connection destination of the combiner 108 to the transmission path 211. If the switch 213c is set to a connection, the connection portion e is short-circuited. Therefore, the connection portion a and the connection portion b, located λ/4 away from the connection portion e, are open-circuited, and the transmission path 212 is regarded as not existing. On the other hand, if the switch 213a and the switch 213b are set to no connections, the transmission path 211 is regarded as connecting the connection portion a and the connection portion b.

Figure 24:
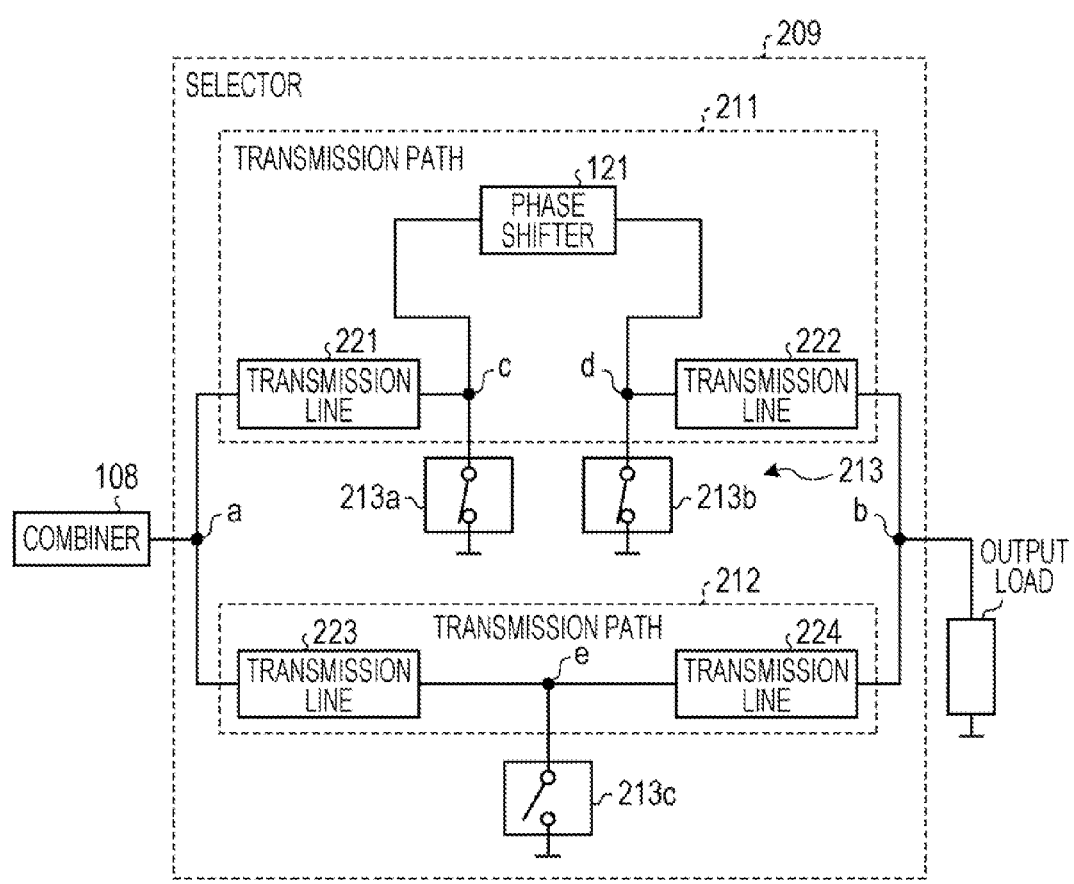
FIG. 24 is a diagram for explaining an example of processing in which the switch controller switches the connection destination of the combiner to a second path.

Next, a case where the switch controller 110 switches the connection destination of the combiner 108 to the transmission path 212 serving as the second path will be described. FIG. 24 is a diagram for explaining an example of processing in which a switch controller switches a connection destination of a combiner to the second path. As illustrated in FIG. 24, the switch controller 110 sets the switch 213a and the switch 213b to connections and sets the switch 213c to no connection, thereby switching the connection destination of the combiner 108 to the transmission path 212. If the switch 213a and the switch 213b are set to connections, the connection portion c and the connection portion d are short-circuited. Therefore, the connection portion a located λ/4 away from the connection portion c and the connection portion b located λ/4 away from the connection portion d are open-circuited, and the transmission path 211 is regarded as not existing. On the other hand, if the switch 213c is set to no connection, the transmission path 212 is regarded as connecting the connection portion a and the connection portion b.

Figure 25:
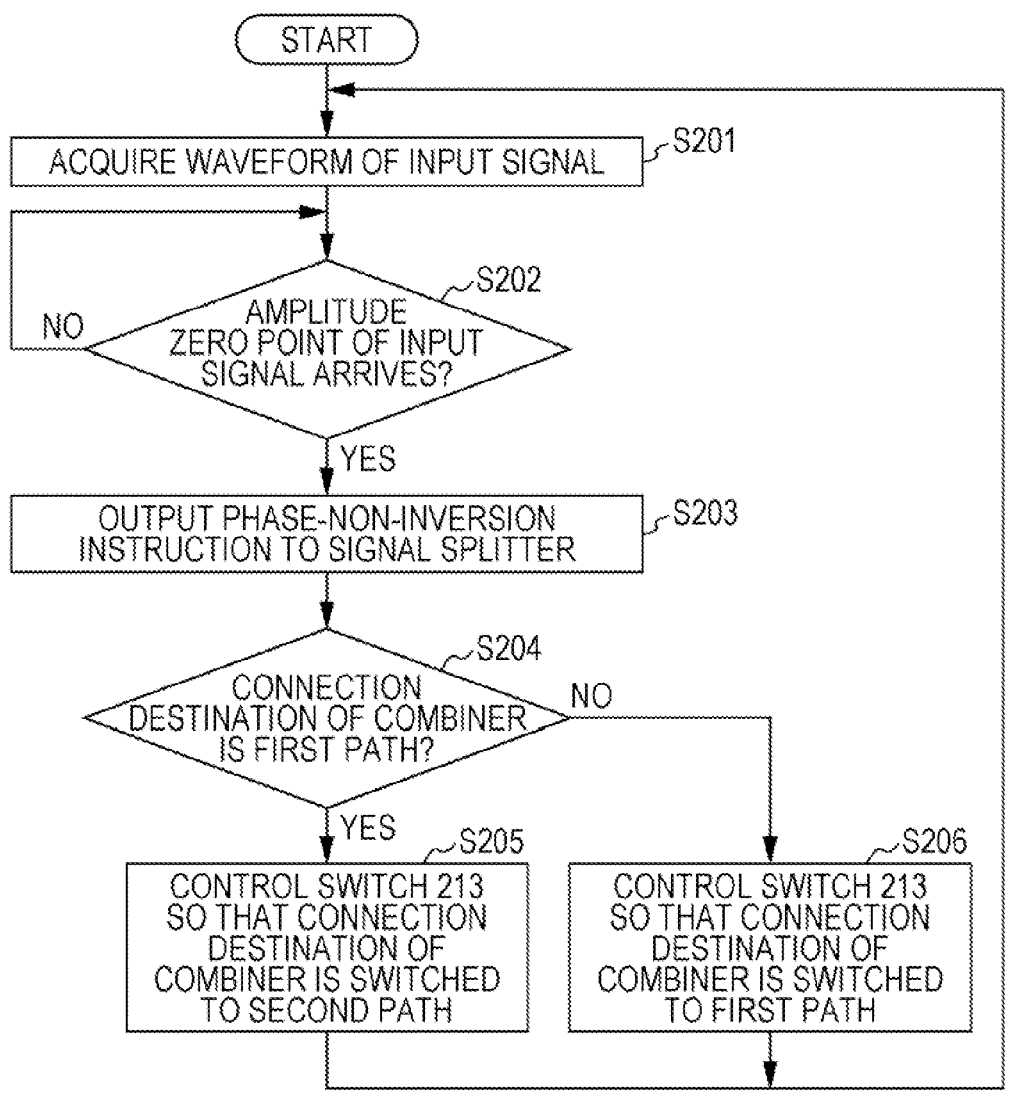
FIG. 25 is a flowchart illustrating a flow of output processing of an output signal in the amplifying device of the second embodiment.

Next, output processing of the output signal in the amplifying device of the second embodiment will be described. FIG. 25 is a flowchart illustrating a flow of the output processing of the output signal in the amplifying device of the second embodiment.

As illustrated in FIG. 25, upon receiving the input signal, the switch controller 110 acquires the waveform of the input signal (operation S201). The switch controller 110 analyzes the acquired waveform, and in a case where the amplitude zero point of the input signal does not arrive, the switch controller 110 waits (operation S202: No).

In a case where the amplitude zero point of the input signal arrives (operation S202: Yes), the switch controller 110 outputs the phase-non-inversion instruction to the signal splitter 101 (operation S203). In a case of receiving the phase-non-inversion instruction from the switch controller 110, the signal splitter 101 dose not invert the phases of the first signal and the second signal 180 degrees even if the amplitude zero point arrives.

In a case where the connection destination of the combiner 108 is the transmission path 211 serving as the first path (operation S204: Yes), the switch controller 110 performs the following processing. In other words, the switch controller 110 controls the switch 213 so that the connection destination of the combiner 108 is switched from the transmission path 211 to the transmission path 212 serving as the second path (operation S205). At this time, the switch controller 110 sets the switch 213a and the switch 213b to connections and sets the switch 213c to no connection, thereby switching the connection destination of the combiner 108 to the transmission path 212. In a case where the connection destination of the combiner 108 is switched to the transmission path 212, the switch 213 causes the output signal, whose phase is non-inverted due to passing of the output signal through the transmission path 212, to be output from the transmission path 212 to the output load.

On the other hand, in a case where the connection destination of the combiner 108 is the transmission path 212 serving as the second path (operation S204: No), the switch controller 110 performs the following processing. In other words, the switch controller 110 controls the switch 213 so that the connection destination of the combiner 108 is switched from the transmission path 212 to the transmission path 211 serving as the first path (operation S206). At this time, the switch controller 110 sets the switch 213a and the switch 213b to no connections and sets the switch 213c to a connection, thereby switching the connection destination of the combiner 108 to the transmission path 211. In a case where the connection destination of the combiner 108 is switched to the transmission path 211, the switch 213 causes the output signal, whose phase is inverted by the phase shifter 121 due to passing of the output signal through the transmission path 211, to be output from the transmission path 211 to the output load.

As above, in the amplifying device of the second embodiment, in accordance with the amplitude zero point of the input signal, switching between the transmission path 211 and the transmission path 212 is controlled using the switch 213a, the switch 213b, and the switch 213c in a state in which the phases of the first signal and second signal input to the respective amplifiers are non-inverted. Therefore, it is possible to switch the connection destination of the combiner 108 while arranging no switches in connection portions between the transmission paths. As a result, according to the second embodiment, in addition to the advantageous effect of the amplifying device of the first embodiment, it is possible to suppress attenuation of a signal in connection portions between the transmission paths. Therefore, it is possible to further reduce deterioration of the output signal, compared with the amplifying device of the first embodiment.

Figure 26:
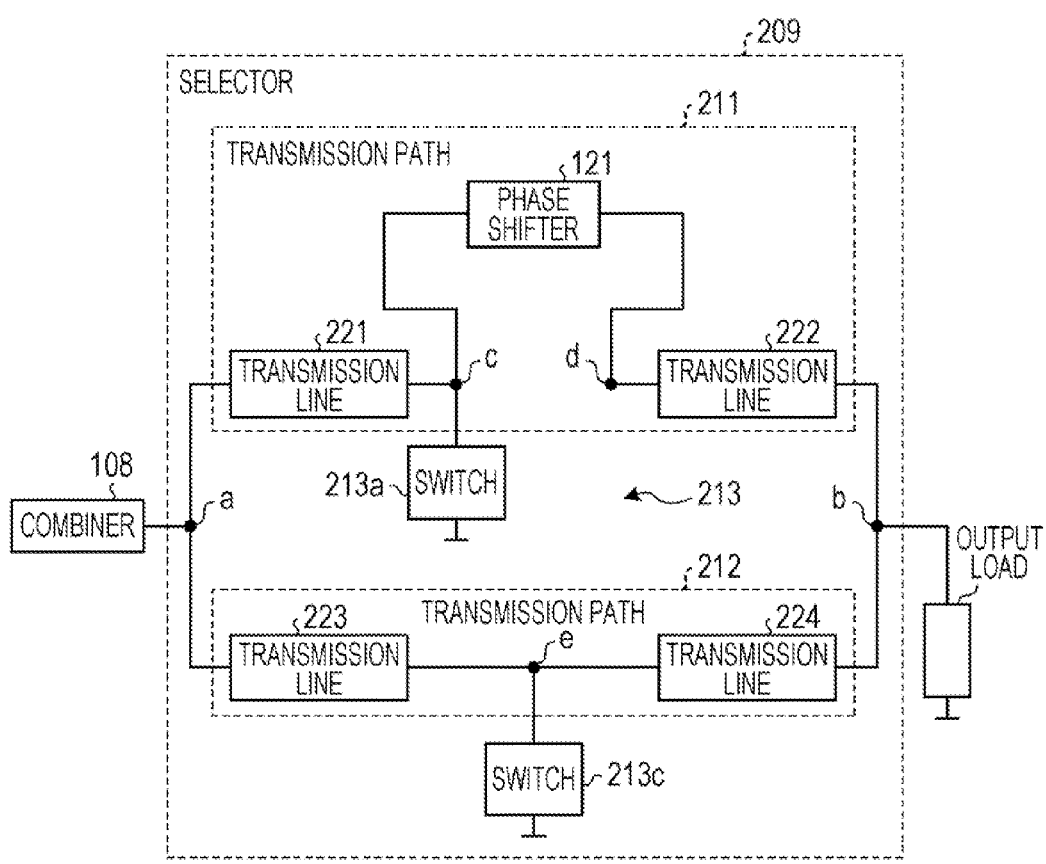
FIG. 26 is a diagram illustrating an example of a modification to the switch in the second embodiment.

Note that while, in the above-mentioned second embodiment, an example in which the switch 213 includes the switches 213a, 213b, and 213c is described, the disclosed technology is not limited to this. As illustrated in, for example, FIG. 26, the switch 213b may be omitted. FIG. 26 is a diagram illustrating an example of a modification to the switch in the second embodiment. In the example of FIG. 26, a case where the switch controller 110 switches the connection destination of the combiner 108 to the transmission path 212 serving as the second path is assumed. In this case, the switch controller 110 sets the switch 213a to a connection and sets the switch 213c to no connection, thereby switching the connection destination of the combiner 108 to the transmission path 212. If the switch 213a is set to a connection, the connection portion c is short-circuited. Therefore, the connection portion a located $\lambda/4$ away from the connection portion c and the connection portion b located $3\lambda/4$ away from the connection portion d are open-circuited, and the transmission path 211 is regarded as not existing. On the other hand, if the switch 213c is set to no connection, the transmission path 212 is regarded as connecting the connection portion a and the connection portion b.

Third Embodiment

A third embodiment is different from the first embodiment in the structure of a selector and a method for switching an output signal selected by the selector. Therefore, in what follows, the structure of the selector and the method for switching the output signal selected by the selector will be mainly described.

Figure 27:
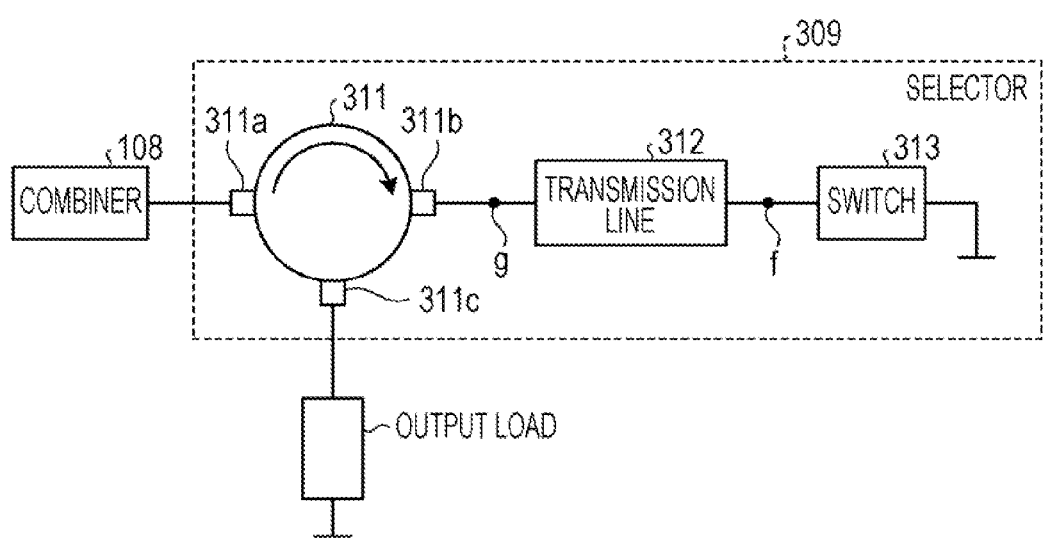
FIG. 27 is a diagram illustrating an example of a configuration of a selector in a third embodiment.

FIG. 27 is a diagram illustrating an example of the configuration of the selector in the third embodiment. Note that the entire configuration of an amplifying device of the third embodiment is illustrated in FIG. 7 in the same way as in the first embodiment. In addition, in the third embodiment, it is assumed that unless otherwise noted, individual units having the same symbols as those in the first embodiment have the same functions as those in the first embodiment.

As illustrated in FIG. 27, in the amplifying device of the third embodiment, a selector 309 includes a circulator 311, a transmission line 312, and a switch 313.

The circulator 311 has ports 311a, 311b, and 311c. The port 311a is connected to the combiner 108. The port 311b is connected to the transmission line 312. The port 311c is connected to the output load. The circulator 311 outputs, to the port 311b, the output signal input from the port 311a and outputs, to the port 311c, a signal input from the port 311b. The ports 311a, 311b, and 311c are examples of first to third ports.

The transmission line 312 has a line length of $\lambda/4$ and is connected to the port 311b.

The switch 313 is a switch that is connected to the transmission line 312 and that switches between a connection and no connection between the transmission line 312 and a ground. Switching between a connection and no connection between the transmission line 312 and the ground in the switch 313 is controlled by the switch controller 110. As the switch 313, such a switch SW" as illustrated in, for example, FIG. 22 may be used. In this case, the terminal TE4 of the switch SW" is connected to the transmission line 312.

Note that, in what follows, it is assumed that a connection portion between the transmission line 312 and the switch 313 is expressed as a "connection portion f" and a connection portion between the transmission line 312 and the port 311b of the circulator 311 is expressed as a "connection portion g".

In a case where the transmission line 312 and the ground are not connected, the switch 313 causes the output signal, output from the port 311b and reflected by the connection portion f, to be input to the port 311b wherein the phase of the output signal is inverted due to passing of the output signal through the transmission line 312. In other words, in a case where the transmission line 312 and the ground are not connected, the connection portion f is open-circuited. Then, the output signal output from the port 311b passes through the transmission line 312, thereby shifting the phase thereof by 90 degrees, is reflected by the connection portion f, and passes through the transmission line 312 again. Accordingly, the phase thereof is further shifted by 90 degrees and the output signal output from the port 311b is finally input to the port 311b. In other words, the output signal passes through the transmission line 312 twice, thereby inverting the phase of the output signal.

In addition, in a case where the transmission line 312 and the ground are connected, the switch 313 causes the output signal, output from the port 311b, to be input to the port 311b wherein the phase of the output signal is non-inverted due to reflection of the output signal by the connection portion g. In other words, in a case where the transmission line 312 and the ground are connected, the connection portion f is short-circuited. Accordingly, the port 311b located $\lambda/4$ away from the connection portion f is open-circuited. Then, the output signal output from the port 311*b* is reflected by the connection portion g and is input to the port 311*b*. In other words, since the output signal is input to the port 311*b* without passing through the transmission line 312, the phase of the output signal is non-inverted.

In addition, in the amplifying device of the third embodiment, in accordance with the amplitude zero point of the input signal, the switch controller 110 switches the output signal, selected by the selector 309, in a state in which the phases of the first signal and second signal output by the signal splitter 101 are non-inverted. Specifically, upon receiving the input signal, the switch controller 110 acquires the waveform of the input signal. The switch controller 110 analyzes the acquired waveform, and in a case where the amplitude zero point arrives, the switch controller 110 outputs, to the signal splitter 101, a phase-non-inversion instruction that instructs the signal splitter 101 to non-invert the phases of the first signal and the second signal. In addition, the switch controller 110 outputs the phase-non-inversion instruction and controls switching between a connection and no connection between the transmission line 312 and the ground in the switch 313. From this, even in a case where the amplitude zero point of the input signal arrives, the phases of the first signal and second signal output by the signal splitter 101 are non-inverted, and the first signal and the second signal each become a smooth signal having no discontinuous portion in the phase thereof.

Figure 28:
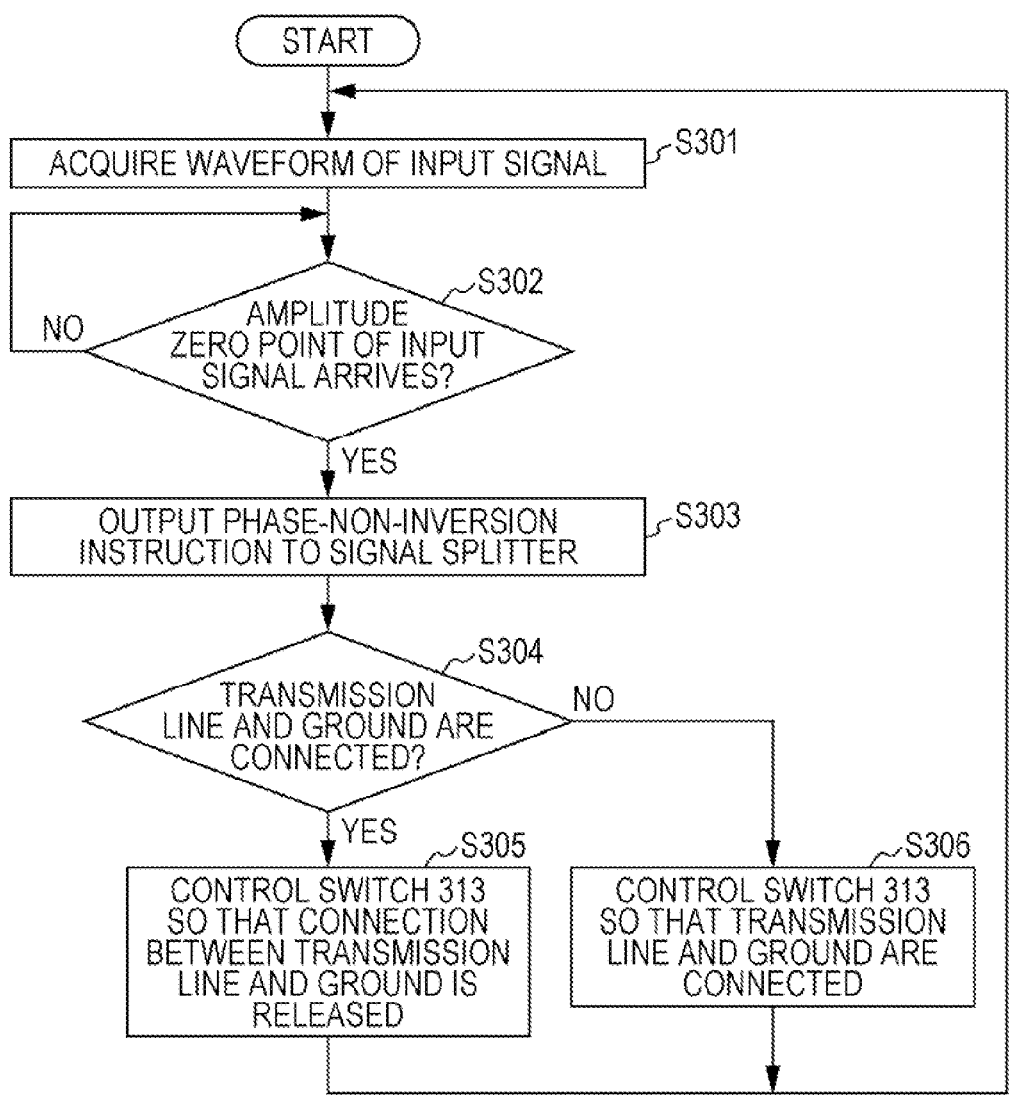
FIG. 28 is a flowchart illustrating a flow of output processing of an output signal in an amplifying device of the third embodiment.

Next, output processing of the output signal in the amplifying device of the third embodiment will be described. FIG. 28 is a flowchart illustrating a flow of the output processing of the output signal in the amplifying device of the third embodiment.

As illustrated in FIG. 28, upon receiving the input signal, the switch controller 110 acquires the waveform of the input signal (operation S301). The switch controller 110 analyzes the acquired waveform, and in a case where the amplitude zero point of the input signal does not arrive, the switch controller 110 waits (operation S302: No).

In a case where the amplitude zero point of the input signal arrives (operation S302: Yes), the switch controller 110 outputs the phase-non-inversion instruction to the signal splitter 101 (operation S303). In a case of receiving the phase-non-inversion instruction from the switch controller 110, the signal splitter 101 dose not invert the phases of the first signal and the second signal 180 degrees even if the amplitude zero point arrives.

In a case where the transmission line 312 and the ground are connected by the switch 313 (operation S304: Yes), the switch controller 110 controls the switch 313 so that the connection between the transmission line 312 and the ground is released (operation S305). In a case where the connection between the transmission line 312 and the ground is released, the switch 313 causes the output signal, output from the port 311*b* and reflected by the connection portion f, to be input to the port 311*b* wherein the phase of the output signal is inverted due to passing of the output signal through the transmission line 312. The circulator 311 outputs, to the port 311*c*, the output signal that is input from the port 311*b* and whose phase is inverted.

On the other hand, in a case where the transmission line 312 and the ground are not connected by the switch 313 (operation S304: No), the switch controller 110 controls the switch 313 so that the transmission line 312 and the ground are connected (operation S306). In a case where the transmission line 312 and the ground are connected, the switch 313 causes the output signal, output from the port 311*b*, to be input to the port 311*b* wherein the phase of the output signal is non-inverted due to reflection of the output signal by the connection portion g. The circulator 311 outputs, to the port 311*c*, the output signal that is input from the port 311*b* and whose phase is non-inverted.

As above, in the amplifying device of the third embodiment, in accordance with the amplitude zero point of the input signal, switching between a connection and no connection between the transmission line 312 and the ground in the switch 313 is controlled in a state in which the phases of the first signal and second signal input to the respective amplifiers are non-inverted. Therefore, it is possible to output the output signal whose phase is inverted while not using paths connected in parallel. As a result, according to the third embodiment, in addition to the advantageous effect of the amplifying device of the first embodiment, it is possible to reduce the number of paths used for outputting the output signal. Therefore, it is possible to achieve downsizing of the device.

Fourth Embodiment

While embodiments of the amplifying device disclosed in the present application are thus far described, the amplifying device may be implemented in various different embodiments in addition to the above-mentioned embodiments. Therefore, in what follows, as a fourth embodiment, examples of a modification to an embodiment will be described.

[1] While an example in which the amplitude zero point of the input signal is used as a timing for switching the output signal is described in each of the first to third embodiments, the disclosed technology is not limited to this. In a case where a minimum value of the amplitude value of the input signal is, for example, a value other than "0", a point of time when the amplitude value of the input signal becomes the minimum value may be used as the timing for switching the output signal. In other words, in accordance with the point of time when the amplitude value of the input signal becomes the minimum value, the switch controller 110 switches the output signal, selected by the selector, in a state in which the phases of the first signal and second signal input to respective amplifiers are non-inverted.

Figure 29:
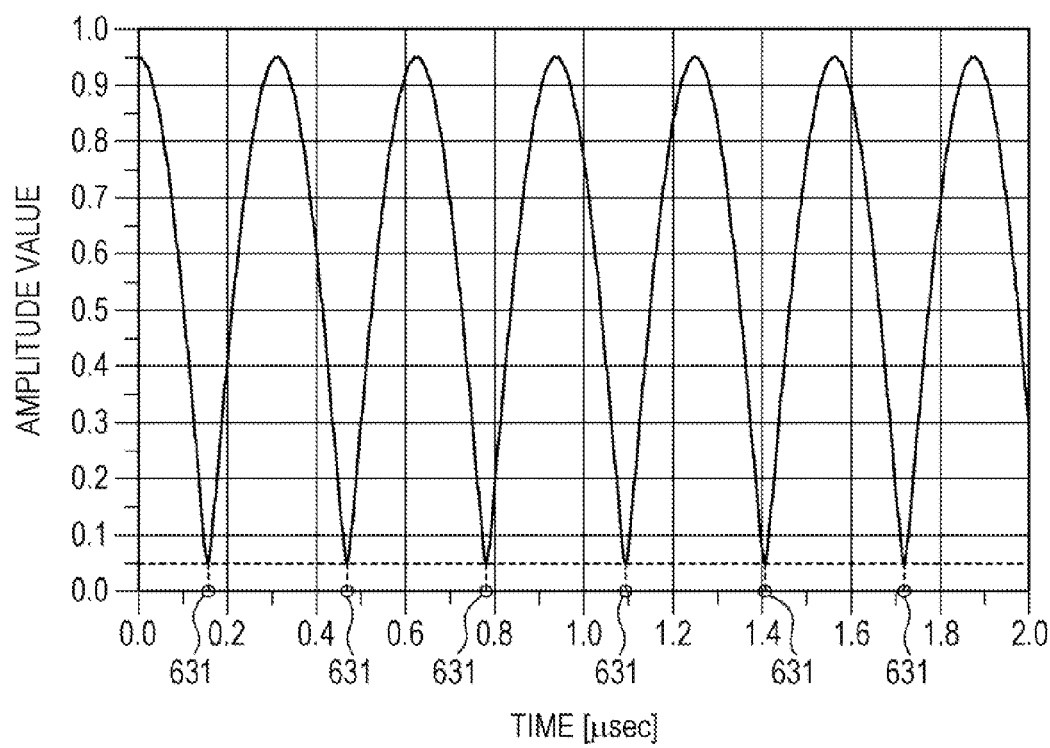
FIG. 29 is a diagram illustrating an example of a waveform of an input signal in a case where a minimum value of an amplitude value of the input signal is a value other than "0"

FIG. 29 is a diagram illustrating an example of a waveform of the input signal in a case where the minimum value of the amplitude value of the input signal is a value other than "0". In FIG. 29, a horizontal axis indicates time, and a vertical axis indicates the amplitude (voltage value) of the input signal.

At a point of time 631, the amplitude value of the input signal, illustrated in FIG. 29, is 0.05 serving as a minimum value with respect to a maximum amplitude, 0.95. In other words, the point of time 631 corresponds to a point of time when the amplitude value of the input signal becomes the minimum value. In a case where such an input signal is input, the switch controller 110 switches the output signal, selected by the selector, in accordance with the point of time 631 in a state in which the phases of the first signal and second signal input to the respective amplifiers are non-inverted. From this, even in a case where a time point when the amplitude value of the input signal becomes the minimum value arrives, the first signal and second signal input to the respective amplifiers each become a smooth signal having no discontinuous portion in the phase thereof.

Figure 30A:
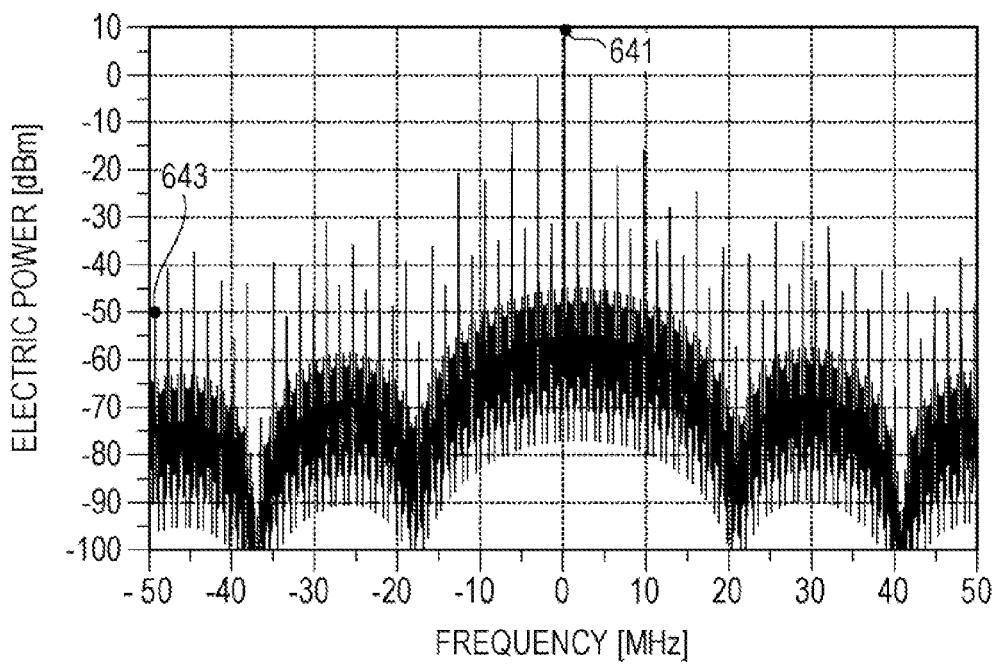
FIG. 30A is a diagram illustrating examples of spectra of a first signal and a second signal input to respective amplifiers in a case where the input signal illustrated in FIG. 29 is input to the amplifying device of the first embodiment.

FIG. 30A is a diagram illustrating examples of spectra of the first signal and the second signal input to the respective amplifiers in a case where the input signal illustrated in FIG.

Figure 30B:
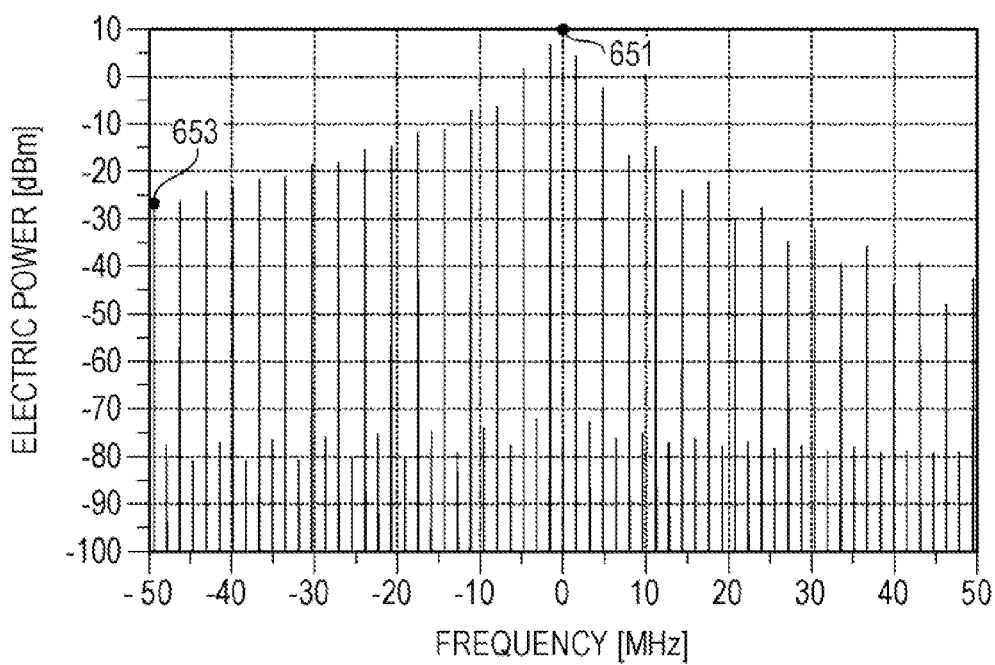
FIG. 30B is a diagram illustrating examples of spectra of the first signal and the second signal input to respective amplifiers in a case where the input signal illustrated in FIG. 29 is input to the outphasing amplifier of the technical premise.

29 is input to the amplifying device of the first embodiment. FIG. 30B is a diagram illustrating examples of spectra of the first signal and the second signal input to the respective amplifiers in a case where the input signal illustrated in FIG. 29 is input to the outphasing amplifier of the technical premise. In each of FIG. 30A and FIG. 30B, a horizontal axis indicates a frequency, and a vertical axis indicates electric power. Note that while, in what follows, for the sake of explanation, an advantageous effect in a case where the input signal is input to the amplifying device of the first embodiment will be described, the same advantageous effect is obtained in a case where the input signal is input to the amplifying device of the second embodiment or the third embodiment.

In the amplifying device of the first embodiment, the first signal and second signal input to the respective amplifiers each have no discontinuous portion in the phase thereof. Therefore, as illustrated in FIG. 30A, in each of the first signal and second signal input to the respective amplifiers, noise components in a frequency band other than a center frequency having a maximum amplitude level in such a manner as a point 641 are relatively small. In the example of, for example, FIG. 30A, a noise component 643 corresponding to a frequency of −50 (MHz) is about −50 (dBm).

In contrast, in the outphasing amplifier of the technical premise, the first signal and second signal input to the respective amplifiers each have a discontinuous portion in the phase thereof. Therefore, as illustrated in FIG. 30B, in each of the first signal and second signal input to the respective amplifiers, noise components in a frequency band other than a center frequency having a maximum amplitude level in such a manner as a point 651 are relatively large. In the example of, for example, FIG. 30B, a noise component 653 corresponding to a frequency of −50 (MHz) is about −25 (dBm). In other words, it is found that, in the amplifying device of the first embodiment, even in a case where the minimum value of the amplitude value of the input signal is a value other than "0", it is possible to suppress deterioration of signals input to the respective amplifiers, compared with the outphasing amplifier of the technical premise.

[2] While an example in which the amplitude zero point of the input signal is used as a timing for switching the output signal is described in each of the first to third embodiments, the disclosed technology is not limited to this. As a timing for switching the output signal, another point of time deviated from an amplitude zero point by a predetermined time period may be used, and another point of time deviated, by a predetermined time period, from a point of time when the amplitude value of the input signal becomes a minimum value may be used. As an example, a case where another point of time deviated from the amplitude zero point by the predetermined time period is used is assumed. In this case, in accordance with the point of time deviated from the amplitude zero point by the predetermined time period, the switch controller 110 switches the output signal, selected by a selector, in a state in which the phases of the first signal and second signal input to the respective amplifiers are non-inverted. Note that the predetermined time period is preliminarily determined so that the amplitude value of the input signal falls within a predetermined range smaller than a maximum value.

Figure 31:
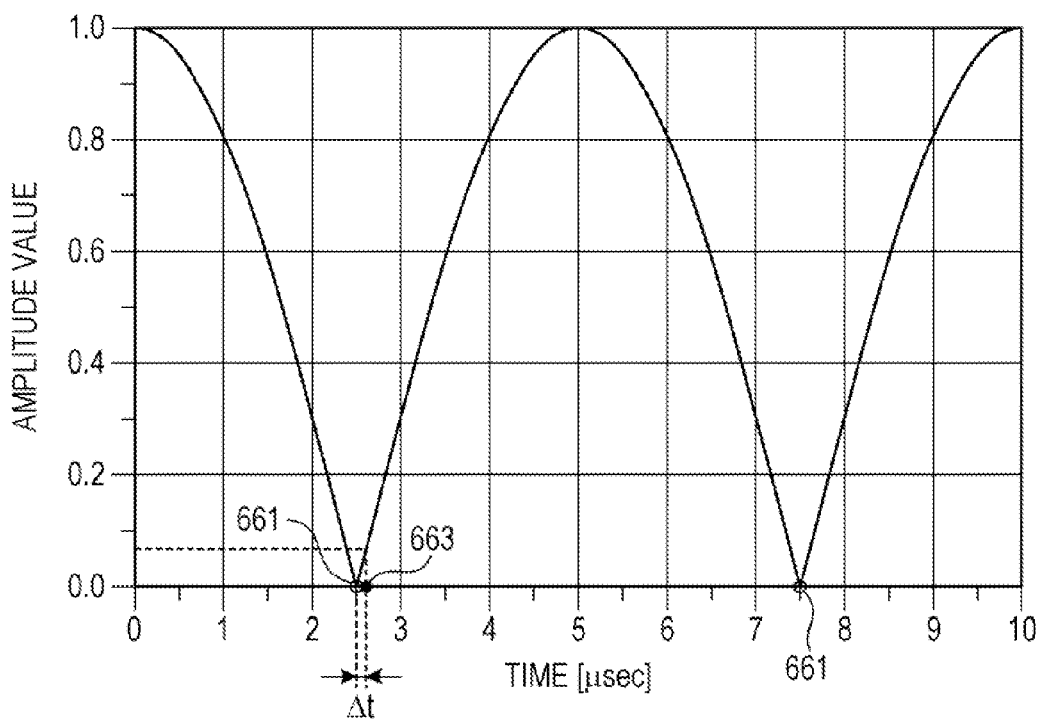
FIG. 31 is a diagram for explaining another point of time deviated from an amplitude zero point by a predetermined time period.

FIG. 31 is a diagram for explaining another point of time deviated from the amplitude zero point by a predetermined time period. In FIG. 31, a horizontal axis indicates time, and a vertical axis indicates the amplitude (voltage value) of the input signal.

At a point of time 661, the amplitude value of the input signal, illustrated in FIG. 31, is "0" serving as a minimum value. In addition, at a point of time 663 deviated from the point of time 661 by a predetermined time period Δt, the amplitude value of the input signal is 0.07 smaller than the maximum value of "1". In other words, the point of time 661 corresponds to the amplitude zero point, and the point of time 663 corresponds to the other point of time deviated from the amplitude zero point by the predetermined time period Δt. In the example of FIG. 31, the predetermined time period Δt is preliminarily determined so that the amplitude value of the input signal becomes 0.07 smaller than the maximum value. In this case, the switch controller 110 switches the output signal, selected by the selector, in accordance with the point of time 663 in a state in which the phases of the first signal and second signal input to the respective amplifiers are non-inverted. From this, in a case where the other point of time deviated from the amplitude zero point by the predetermined time period arrives, the first signal and second signal input to the respective amplifiers each become a signal having a suppressed discontinuous portion in the phase thereof.

Figure 32:
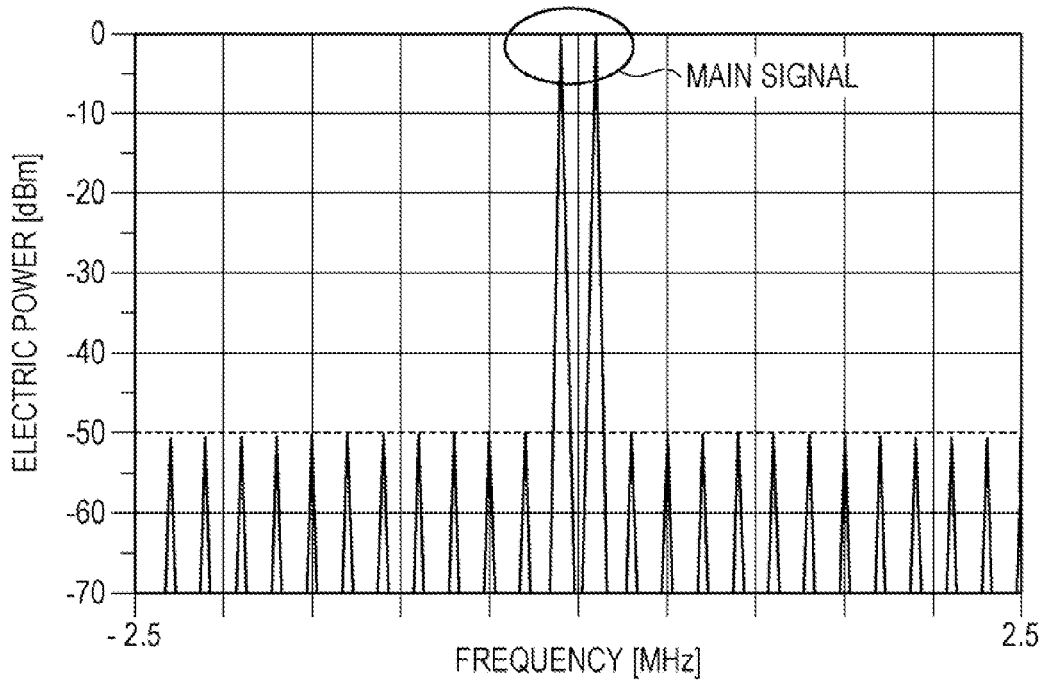
FIG. 32 is a diagram illustrating an example of a spectrum of an output signal output by the amplifying device of the first embodiment in a case where, using the amplifying device, the output signal is switched in accordance with another point of time deviated from an amplitude zero point by a predetermined time period $\Delta t$.

FIG. 32 is a diagram illustrating an example of a spectrum of an output signal output by the amplifying device of the first embodiment in a case where, using the amplifying device, the output signal is switched in accordance with the other point of time deviated from the amplitude zero point by the predetermined time period Δt. In FIG. 32, a horizontal axis indicates time, and a vertical axis indicates electric power. In addition, in FIG. 32, the predetermined time period Δt is preliminarily determined so that the amplitude value of the input signal becomes 0.07 smaller than a maximum value. Note that while, in what follows, for the sake of explanation, an advantageous effect in a case of using the amplifying device of the first embodiment will be described, the same advantageous effect is obtained in a case of using the amplifying device of the second embodiment or the third embodiment.

As illustrated in FIG. 32, in the amplifying device of the first embodiment, in a case where the output signal is switched in accordance with the other point of time deviated from the amplitude zero point by the predetermined time period Δt, noise components in a frequency band other than a frequency of a main signal are about −50 (dBm). This means that in a case where, in a system, electric power less than or equal to −50 (dBm) is acceptable as the electric power of a noise component with respect to the main signal, the other point of time deviated from the amplitude zero point by the predetermined time period Δt may be adopted as a timing for switching the output signal.

[3] While an example in which the phase of the output signal is inverted 180 degrees is described in each of the first to third embodiments, the disclosed technology is not limited to this. The phase of the output signal may be inverted, for example, (180±Δθ) degrees. Δθ is an error based on 180 degrees. In other words, "the phase of the output signal is inverted" includes that the phase of the output signal is inverted (180±Δθ) degrees.

Figure 33:
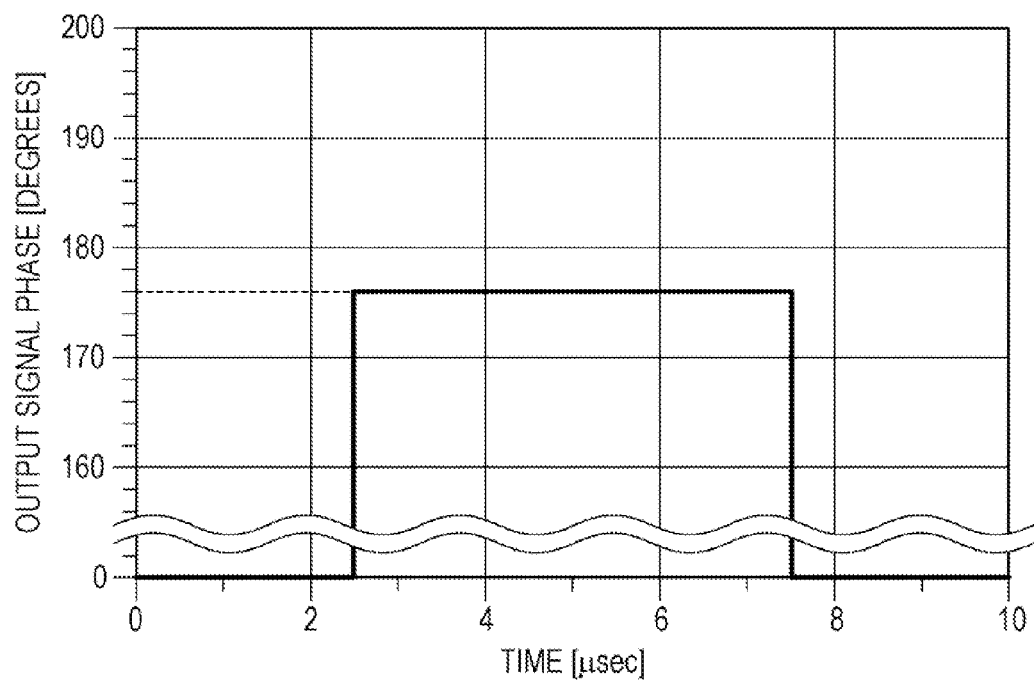
FIG. 33 is a diagram for explaining a state in which a phase of an output signal is inverted $(180 \pm \Delta\theta)$ degrees.

FIG. 33 is a diagram for explaining a state in which the phase of the output signal is inverted (180±Δθ) degrees. In FIG. 33, a horizontal axis indicates time, and a vertical axis indicates the phase of the output signal.

As illustrated in FIG. 33, the phase of the output signal is inverted 176 degrees at 2.5 (μsec), and after that, the phase of the output signal is inverted 176 degrees at 7.5 (μsec). In this case, Δθ serving as an error based on 180 degrees is 180−176=4 degrees.

Figure 34:
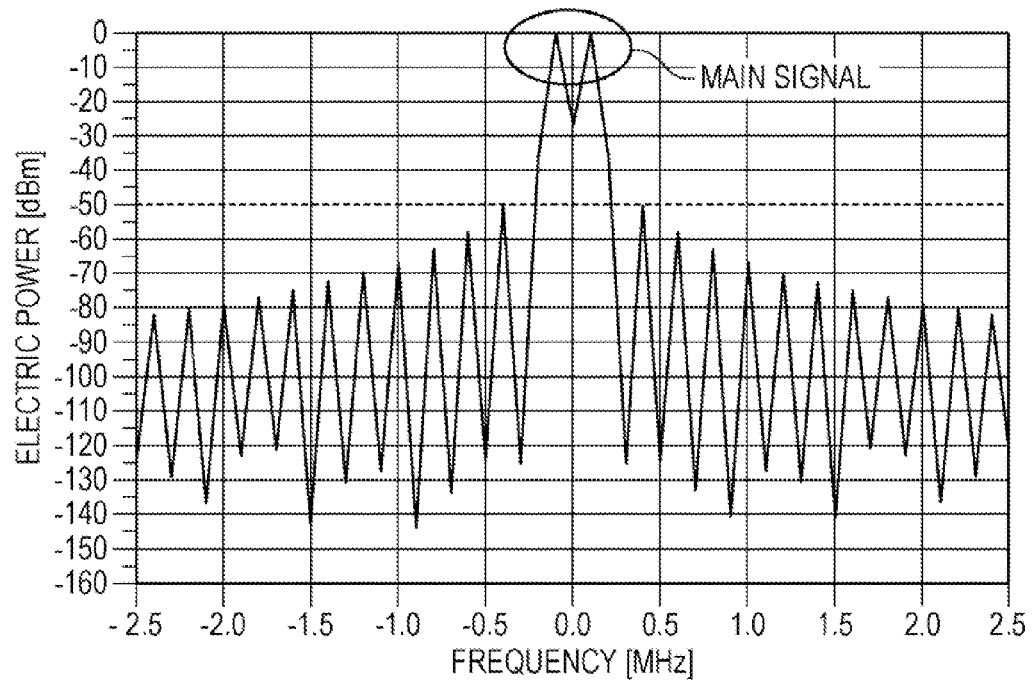
FIG. 34 is a diagram illustrating an example of a spectrum of an output signal output by the amplifying device of the first embodiment in a case where, using the amplifying device, a phase of the output signal is inverted $(180 \pm \Delta\theta)$ degrees.

FIG. 34 is a diagram illustrating an example of a spectrum of the output signal output by the amplifying device of the first embodiment in a case where, using the amplifying device, the phase of the output signal is inverted (180±Δθ) degrees. In FIG. 34, it is assumed that Δθ serving as an error based on 180 degrees is 4 degrees. Note that while, in what follows, for the sake of explanation, an advantageous effect in a case of using the amplifying device of the first embodiment will be described, the same advantageous effect is obtained in a case of using the amplifying device of the second embodiment or the third embodiment.

As illustrated in FIG. 34, in the amplifying device of the first embodiment, in a case where the phase of the output signal is inverted (180±AO) degrees, noise components in a frequency band other than a frequency of a main signal are about −50 (dBm). This means that in a case where, in a system, electric power less than or equal to −50 (dBm) is acceptable as the electric power of a noise component with respect to the main signal, 4 degrees may be permitted as Δθ serving as an error based on 180 degrees.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifying device comprising:
a signal splitter configured to split an input signal to a plurality of signals having a phase difference between the plurality of signals fluctuating in accordance with an absolute value of an amplitude of the input signal;
a plurality of amplifiers configured to amplify the plurality of signals respectively;
a combiner configured to combine a plurality of signals amplified by the plurality of amplifiers to generate an output signal;
a selector configured to select one of the output signal whose phase is inverted and the output signal whose phase is non-inverted; and
a switch controller configured to control the signal splitter so that phases of the plurality of signals are non-inverted, and to control the selector so that the selector selects one of the output signal whose phase is inverted and the output signal whose phase is non-inverted, in accordance with a first point of time when the absolute value of the amplitude of the input signal becomes a minimum or a second point of time deviated from the first point of time by a predetermined time period.

2. The amplifying device according to claim 1,
wherein the selector includes
a first path including a phase shifter configured to shift a phase of the output signal generated by the combiner by 180×(2n−1) degrees to invert a phase of the output signal, wherein "n" is a positive integer,
a second path configured to be arranged in parallel to the first path, the second path not having the phase shifter, and
a switch configured to switch a connection destination of the combiner to the first path or the second path.

3. The amplifying device according to claim 2,
wherein the first path further includes
first and second transmission lines whose line lengths are λ/4 and that are connected in series to an input end and an output end, respectively, of the phase shifter, wherein "λ" is a wavelength of the input signal,
wherein the second path includes
third and fourth transmission lines whose line lengths are λ/4 and that are connected in series to each other,
wherein the switch includes
a first switch configured to switch between a connection and no connection between a ground and a connection portion between the first transmission line and the input end of the phase shifter,
a second switch configured to switch between a connection and no connection between a ground and a connection portion between the second transmission line and the output end of the phase shifter, and
a third switch configured to switch between a connection and no connection between a ground and a connection portion between the third transmission line and the fourth transmission line, and
wherein the switch controller sets the first switch and the second switch to no connections and sets the third switch to a connection so as to switch the connection destination of the combiner to the first path, and sets the first switch and the second switch to connections and sets the third switch to no connection so as to switch the connection destination of the combiner to the second path.

4. The amplifying device according to claim 2,
wherein the phase shifter is a transmission line whose line length is λ/2×(2n−1), wherein "λ" is a wavelength of the input signal.

5. The amplifying device according to claim 1,
wherein the selector includes
a circulator configured to include a first port connected to the combiner, a second port, and a third port, the circulator outputting the output signal input to the first port to the second port, and outputting a signal input to the second port to the third port,
a transmission line whose line length is λ/4, connected to the second port, wherein "λ" is a wavelength of the input signal, and
a switch connected to the transmission line and a ground, and configured to switch a connection and no connection between the transmission line and the ground,
wherein, when the switch is controlled to switch to the no connection between the transmission line and the ground, the output signal output from the second port and reflected by a connection portion between the transmission line and the switch is input to the second port, a phase of the output signal reflected by the connection portion between the transmission line and the switch being inverted, and
wherein, when the switch is controlled to switch to the connection between the transmission line and the ground, the output signal output from the second port and reflected by a connection portion between the transmission line and the second port is input to the second port, a phase of the output signal reflected by the connection portion between the transmission line and the second port being not inverted.

* * * * *